United States Patent
Sharon et al.

(10) Patent No.: US 10,554,227 B2
(45) Date of Patent: Feb. 4, 2020

(54) DECODING OPTIMIZATION FOR CHANNEL MISMATCH

(71) Applicant: Western Digital Technologies, Inc., Irvine, CA (US)

(72) Inventors: Eran Sharon, Rishon Lezion (IL); Alexander Bazarsky, Holon (IL); Ariel Navon, Revava (IL); Omer Fainzilber, Even-Yehuda (IL)

(73) Assignee: Western Digital Technologies, Inc., Irvine, CA (US)

( * ) Notice: Subject to any disclaimer, the term of this patent is extended or adjusted under 35 U.S.C. 154(b) by 178 days.

(21) Appl. No.: 15/589,332

(22) Filed: May 8, 2017

(65) Prior Publication Data

US 2018/0262215 A1   Sep. 13, 2018

Related U.S. Application Data

(60) Provisional application No. 62/469,809, filed on Mar. 10, 2017.

(51) Int. Cl.
| | | |
|---|---|---|
| *H03M 13/00* | (2006.01) | |
| *H03M 13/45* | (2006.01) | |
| *G11C 29/52* | (2006.01) | |

(52) U.S. Cl.
CPC ........... *H03M 13/458* (2013.01); *G11C 29/52* (2013.01)

(58) Field of Classification Search
CPC ............. H03M 13/458; H03M 13/1111; G06F 11/1012; G11C 29/52
See application file for complete search history.

(56) References Cited

U.S. PATENT DOCUMENTS

| | | | | |
|---|---|---|---|---|
| 7,797,480 B2* | 9/2010 | Mokhlesi | ............ | G11C 11/5642 365/185.01 |
| 7,805,664 B1* | 9/2010 | Yang | ...................... | H03M 13/41 375/261 |
| 8,040,985 B2* | 10/2011 | Montekyo | ............... | H04L 1/205 375/346 |
| 8,286,048 B1 | 10/2012 | Chen et al. | | |
| 8,438,461 B2* | 5/2013 | Varnica | ................ | H03M 13/112 714/774 |
| 8,494,877 B1* | 7/2013 | Paul | ....................... | G06Q 10/10 705/2 |
| 9,337,866 B2* | 5/2016 | Gasanov | ............ | H03M 13/1111 |
| 2014/0019819 A1* | 1/2014 | Nakanishi | .............. | H03M 13/11 714/752 |

* cited by examiner

*Primary Examiner* — Esaw T Abraham
(74) *Attorney, Agent, or Firm* — Dickinson Wright PLLC

(57) ABSTRACT

A memory system configured to decode a data set may pause a convergence process to update reliability metric values. The memory system may utilize a positive feedback system that updates the reliability metric values by analyzing current a posteriori reliability metric values to calculate average estimated reliability characteristic values associated with a memory error model. The updates to the reliability metric values may provide increased error correction capability and faster decoding.

15 Claims, 12 Drawing Sheets

DECODING OPTIMIZATION FOR CHANNEL MISMATCH

CROSS-REFERENCE TO RELATED APPLICATIONS

This application claims the benefit of U.S. Provisional Application No. 62/469,809, filed Mar. 10, 2017. The contents of U.S. Provisional Application No. 62/469,809 are incorporated by reference in their entirety.

BACKGROUND

Memory systems may encode and decode data with parity bits that provide redundancy and error correction capability for the data when read from the memory. Decoding schemes may use log likelihood ratios (LLR) associated with the bits to assist in decoding. The LLR values chosen for the bits may be based on an underlying model that assumes or estimates certain conditions related to the memory in which the bits are stored, the channel over which the bits are communicated, and the associated bit error rates. However, if the actual conditions differ from what is assumed or estimated, the LLRs that are used may not be optimal for decoding the data. In turn, the decoding process may not be as fast as it could be and/or the decoder may struggle to fully decode the data. As such, decoding schemes that utilize more optimal LLR values for decoding data may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION OF EMBODIMENTS

Overview

Figure 1A:
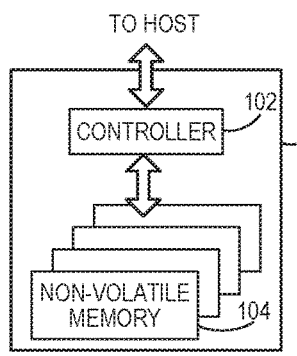
FIG. 1A is a block diagram of an example non-volatile memory system.

By way of introduction, the below embodiments relate to memory systems and methods for decoding data, where a convergence process is stopped or paused to update LLR values used during the convergence process. In one embodiment, a storage device includes a controller configured to: perform a convergence process to decode a data set; before convergence for the data set is achieved, generate at least one updated set of reliability metric values to decode the data set based on at least one calculated set of estimated reliability characteristic values for the data set; and complete the convergence process using the at least one updated set of reliability metric values.

In some embodiments, the controller is further configured to pause the convergence process before the convergence is achieve, and generate the at least one updated set of reliability metric values while the convergence process is paused.

In some embodiments, the controller is configured to: generate a set of reliability metric values during a portion of the convergence process; calculate a set of estimated reliability characteristic values of the at least one calculated set of estimated reliability characteristic values based on magnitude components of the set of reliability metric values and whether sign components of the set of reliability metric values correspond to associated hard bit representations of the data set; generate an updated set of reliability metric values of the at least one updated set of reliability metric values based on the set of estimated reliability characteristic values; and perform a second portion of the convergence process using the updated set of reliability metric values.

In some embodiments, the at least one updated set of reliability metric values includes at least one updated set of a posteriori reliability metric values, and the controller is configured to: calculate average, estimated reliability characteristic values for a plurality of reliability bins based on the at least one set of estimated reliability characteristic values; generate an updated set of a priori reliability metric values based on the average, estimated reliability characteristic values; generate an updated set of a posteriori reliability metric values of the at least one updated set of a posteriori reliability metric values based on the updated set of a priori reliability metric values; and perform a portion of the convergence process using the updated set of a posteriori reliability metric values.

In some embodiments, the controller is further configured to generate a current set of a posteriori reliability metric values upon performing a current portion of the convergence process; and generate the updated set of a posteriori reliability metric values based on the current set of a posteriori reliability metric values and the updated set of a priori reliability metric values.

In some embodiments, the controller is configured to generate the updated set of a posteriori reliability metric values further based on a prior set of a priori reliability metric values.

In some embodiments, the controller is further configured to determine a set of reliability bins based on bits of the data set being stored in good and bad storage locations; and generate the at least one updated set of reliability metric values further based on the reliability bins.

In some embodiments, the controller is further configured to determine a set of reliability bins based on a state of a neighboring or adjacent memory component; and generate the at least one updated set of reliability metric values further based on the reliability bins.

In another embodiment, a storage device includes a controller configured to pause a convergence process to decode a data set after a portion of the convergence process is performed but before convergence is achieved; calculate a set of reliability characteristic values associated with a memory error model based on a current set of reliability metric values generated from the portion of the convergence process; generate an updated set of reliability metric values based on the set of reliability characteristic values; and resume the convergence process using the updated set of reliability metric values.

In some embodiments, the controller is configured to pause the convergence process based on whether a number of iterations of the convergence process has reached or exceeded a threshold level.

In some embodiments, the controller is configured to pause the convergence process based on magnitude components of the set of LLR values indicating that a progress level of the convergence process is below a threshold.

In some embodiments, the controller is configured to calculate the set of reliability characteristic values based on magnitude components of the current set of reliability metric values and whether sign components of the current set of reliability metric values correspond to associated hard bit representations of the data set.

In some embodiments, the current set of reliability metric values includes a current set of a posteriori log likelihood ratio (LLR) values, the updated set of reliability metric values includes an updated set of a posteriori LLR values, and the controller is further configured to, while the convergence process is paused, calculate expected, estimated bit error rates for a plurality of reliability bins based on the set of reliability characteristic values; generate an updated set of a priori LLR values based on the expected, estimated bit error rates; and generate the updated set of a posteriori LLR values based on the current set of a posteriori LLR values and the updated set of a priori LLR values.

In some embodiments, the controller is configured to generate the updated set of a posteriori LLR values further based on a prior set of a priori LLR values.

In another embodiment, a decoding method includes: starting, with a controller, a first portion of a convergence process to decode a read data set using an initial set of reliability metric values generated based on a set of reliability bins; changing, with the controller, a configuration of the set of reliability bins; generating, with the controller, an updated set of reliability metric values according to the changed configuration of the set of reliability bins; starting, with the controller, a second portion of the convergence process using the updated set of a reliability metric values; and completing, with the controller, the convergence process based on the updated set of reliability metric values.

In some embodiments, the method further includes: before changing the configuration of the set of reliability bins, associating, with the controller, bits of the read data set with the reliability bins; and after changing the configuration of the set of reliability bins, re-associating, with the controller, the bits of the read data set with the reliability bins according to the change in the configuration.

In some embodiments, changing the configuration of the set of reliability bins includes changing, with the controller, a total number of the reliability bins.

In some embodiments, changing the total number of reliability bins includes increasing the total number of reliability bins.

In some embodiments, changing the configuration of the set of reliability bins includes changing, with the controller, the configuration of the set of reliability bins based on a change in reliability features used to determine the set of reliability bins.

In some embodiments, changing the configuration includes increasing, with the controller, a number of reliability bins according to an increase in a number of the reliability features used to determine the set of reliability bins.

In another embodiment, a storage device includes: means for performing a convergence process to decode a data set; means for generating at least one updated set of reliability metric values to decode the data set before convergence for the data set is achieved, the updated set of reliability metric values based on at least one calculated set of estimated reliability characteristic values for the data set; and means for completing the convergence process using the at least one updated set of reliability metric values.

Other embodiments are possible, and each of the embodiments can be used alone or together in combination. Accordingly, various embodiments will now be described with reference to the attached drawings.

Embodiments

The following embodiments describe non-volatile memory systems and related methods for updating memory error model values during a convergence process based on information gained from performing a portion of the convergence process. The updated memory error model values are then used for updating reliability metric values used for another portion of the convergence process. Before turning to these and other embodiments, the following paragraphs provide a discussion of exemplary non-volatile memory systems and storage modules that can be used with these embodiments. Of course, these are just examples, and other suitable types of non-volatile memory systems and/or storage modules can be used.

FIG. 1A is a block diagram illustrating a non-volatile memory system 100. The non-volatile memory system 100 may include a controller 102 and non-volatile memory that may be made up of one or more non-volatile memory dies 104. As used herein, the term die refers to the set of non-volatile memory cells, and associated circuitry for managing the physical operation of those non-volatile memory cells, that are formed on a single semiconductor substrate. The controller 102 may interface with a host system and transmit command sequences for read, program, and erase operations to the non-volatile memory die(s) 104.

The controller 102 (which may be and/or referred to as a flash memory controller) can take the form of processing circuitry, a microprocessor or processor, and a computer-readable medium that stores computer-readable program code (e.g., software or firmware) executable by the (micro) processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

The controller 102 may be configured to manage data stored in the memory 104 and communicate with a host, such as a computer or electronic device. The controller 102 may have various functionality in addition to the specific functionality described herein. For example, the controller 102 can format the memory 104 to ensure that the memory 104 is operating properly, map out bad flash memory cells, and allocate spare cells to be substituted for future failed cells. Some part of the spare cells can be used to hold firmware to operate the controller 102 and implement other features. In operation, when a host needs to read data from or write data to the memory 104, it will communicate with the controller 102. If the host provides a logical address to which data is to be read/written, the controller 102 can convert the logical address received from the host to a physical address in the memory 104. (Alternatively, the host can provide the physical address). The controller 102 can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 102 and the non-volatile memory die(s) 104 may be any suitable flash interface, such as Toggle Mode 200, 400, or 800 as non-limiting examples. In one embodiment, the memory system 100 may be a card based system, such as a secure digital (SD) or a micro secure digital (micro-SD) card. In an alternate embodiment, the system 100 may be part of an embedded memory system.

The non-volatile memory system 100 may include a single channel between the controller 102 and the non-volatile memory die(s) 104, or multiple (e.g., 2, 4, 8 or more) channels between the controller 102 and the NAND memory die(s) 104. How many channels exist may depend on various factors, such as the capabilities of the controller 102, the number of memory dies 104, and/or layout or organization of the memory elements in the memory dies 104, as non-limiting examples. In any of the embodiments described herein, more than a single channel may exist between the controller and the memory die(s)s 104, even if a single channel is shown in the drawings.

Figure 1B:
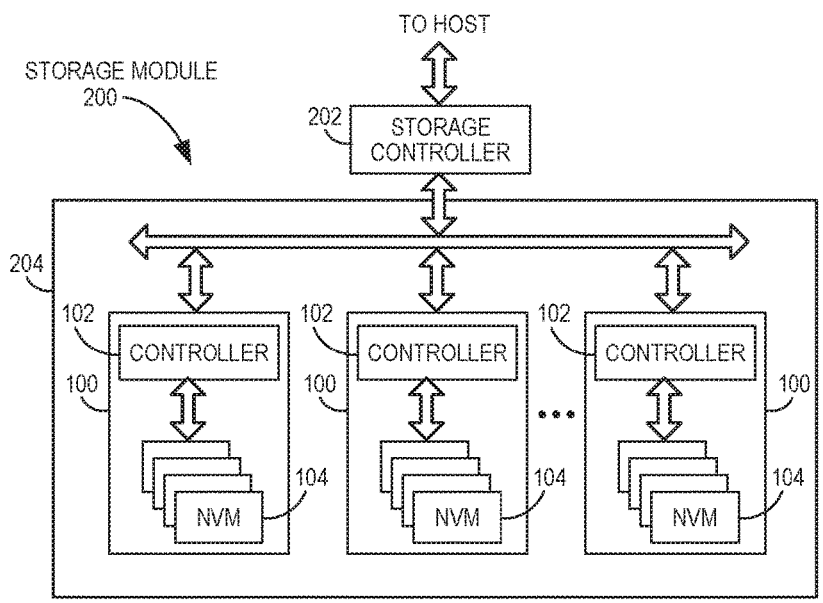
FIG. 1B is a block diagram of a storage module that includes a plurality of non-volatile memory systems.

FIG. 1B illustrates a storage module 200 that includes plural non-volatile memory systems 100. As such, the storage module 200 may include a storage controller 202 that interfaces with a host and with a storage system 204, which includes a plurality of non-volatile memory systems 100. The interface between the storage controller 202 and non-volatile memory systems 100 may be a bus interface, such as a serial advanced technology attachment (SATA), a peripheral component interface express (PCIe) interface, an embedded MultiMediaCard (eMMC) interface, a SD interface, or a Universal Serial Bus (USB) interface, as examples. The storage system 200, in one embodiment, may be a solid state drive (SSD), such as found in portable computing devices, such as laptop computers and tablet computers, and mobile phones.

Figure 1C:
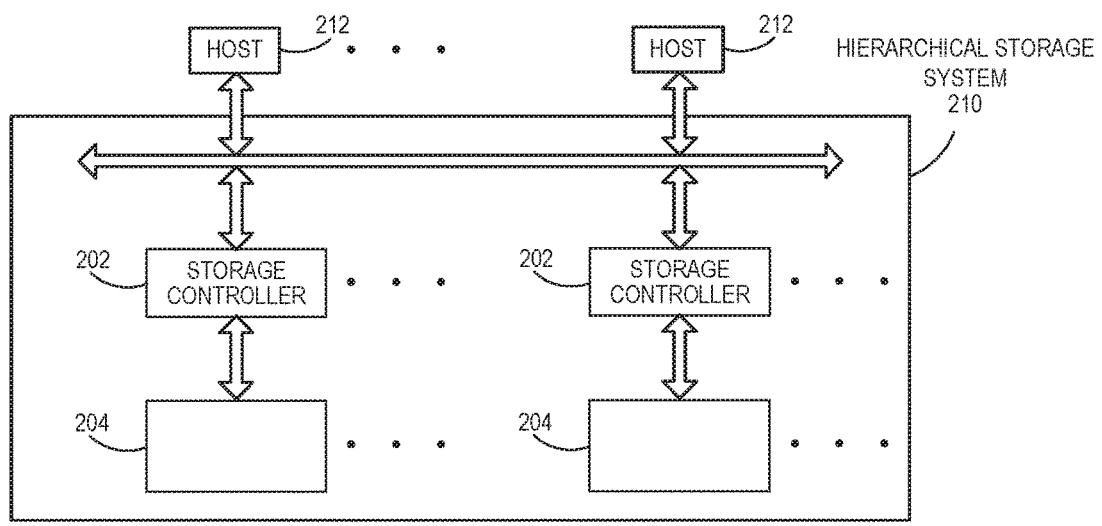
FIG. 1C is a block diagram of a hierarchical storage system.

FIG. 1C is a block diagram illustrating a hierarchical storage system 210. The hierarchical storage system 210 may include a plurality of storage controllers 202, each of which control a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 210 illustrated in FIG. 1C may be a rack mountable mass storage system that is accessible by multiple host computers, such as would be found in a data center or other location where mass storage is needed.

Figure 2A:
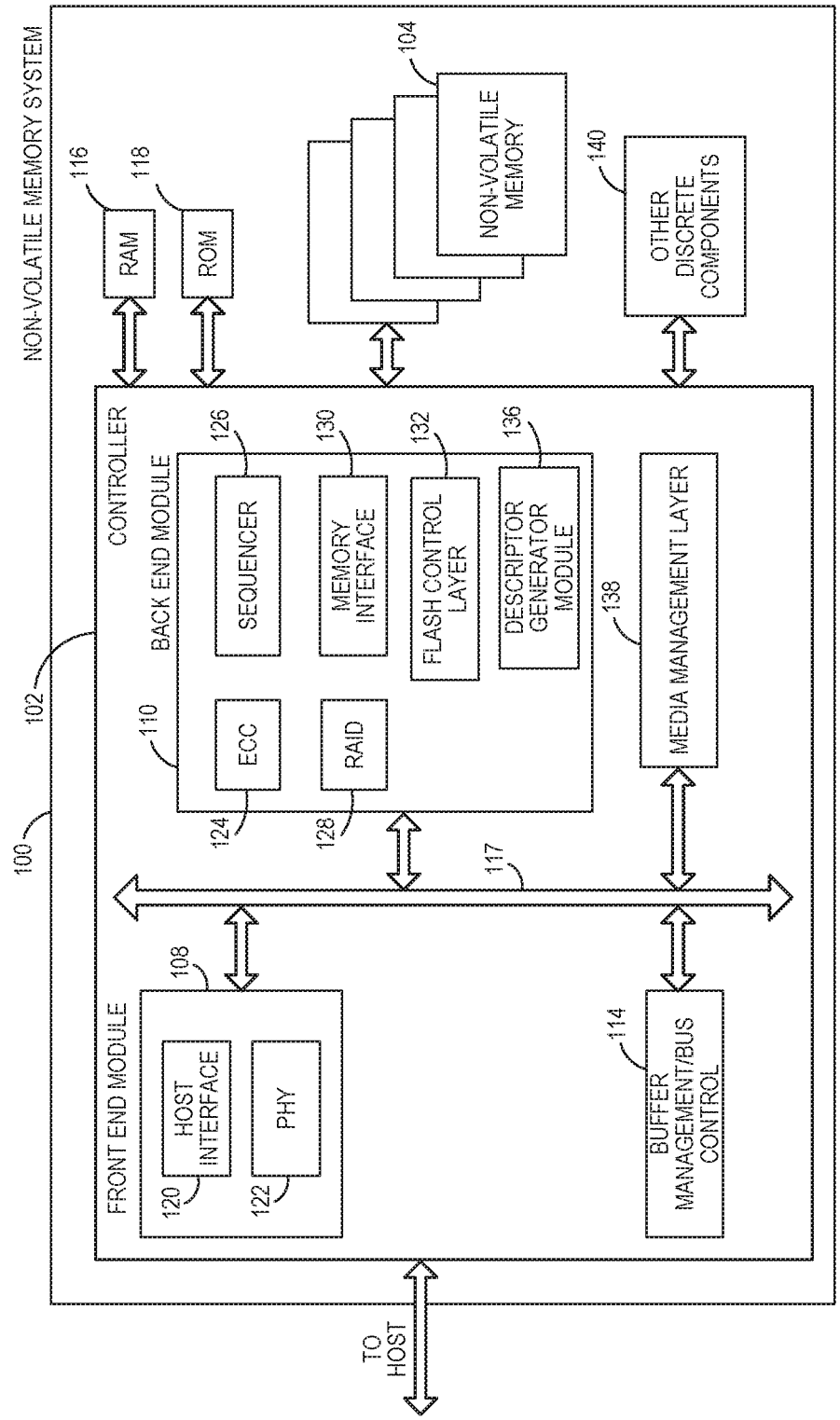
FIG. 2A is a block diagram of example components of a controller of the non-volatile memory system of FIG. 1A.

FIG. 2A is a block diagram illustrating exemplary components of the controller 102 in more detail. The controller 102 may include a front end module 108 that interfaces with a host, a back end module 110 that interfaces with the non-volatile memory die(s) 104, and various other modules that perform various functions of the non-volatile memory system 100.

In general, as used herein, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer manager/bus controller module 114 that manages buffers in random access memory (RAM) 116 and controls the internal bus arbitration for communication on an internal communications bus 117 of the controller 102. A read only memory (ROM) 118 may store and/or access system boot code. Although illustrated in FIG. 2A as located separately from the controller 102, in other embodiments one or both of the RAM 116 and the ROM 118 may be located within the controller 102. In yet other embodiments, portions of RAM 116 and ROM 118 may be located both within the controller 102 and outside the controller 102. Further, in some implementations, the controller 102, the RAM 116, and the ROM 118 may be located on separate semiconductor dies.

Additionally, the front end module 108 may include a host interface 120 and a physical layer interface (PHY) 122 that provide the electrical interface with the host or next level storage controller. The choice of the type of the host interface 120 can depend on the type of memory being used. Examples types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction controller (ECC) engine 124 that encodes the data bytes received from the host, and decodes and error corrects the data bytes read from the non-volatile memory 104. The back end module 110 may also include a command sequencer 126 that generates command sequences, such as program, read, and erase command sequences, to be transmitted to the non-volatile memory die(s) 104. Additionally, the back end module 110 may include a RAID (Redundant Array of Independent Drives) module 128 that manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to the non-volatile memory die(s) 104 and receives status information from the non-volatile memory die(s) 104. Along with the command sequences and status information, data to be programmed into and read from the non-volatile memory die(s) 104 may be communicated through the memory interface 130. In one embodiment, the memory interface 130 may be a double data rate (DDR) interface, such as a Toggle Mode 200, 400, or 800 interface. A flash control layer 132 may control the overall operation of back end module 110.

In addition, the back end module 110 may include a descriptor generator module 136 that is configured to generate descriptors at least for the encoding and decoding performed by the ECC engine 124. As described in further detail below, when data is to be written to the non-volatile memory dies 104, such as in response to a host write request, the descriptor generator module 136 may generate a descriptor associated with the data and provide the descriptor to the ECC engine 124. In response to receipt of the descriptor, the ECC engine 124 may retrieve the data, which may be stored in RAM 116, and encode the data prior to it being written to the non-volatile memory dies 104. In addition, when data is read from the non-volatile memory dies 104, such as in response to a host read request, the descriptor generator module 136 may generate a descriptor associated with the data and provide the descriptor to the ECC engine 124. In response to receipt of the descriptor, the ECC engine 124 may retrieve the data, which may be stored in RAM 116, and decode the data prior to it being sent to its final destination, such as to the host.

Additional modules of the non-volatile memory system 100 illustrated in FIG. 2A may include a media management layer 138, which may perform certain storage management functions, such as address management and wear leveling of memory cells of the non-volatile memory die 104. The non-volatile memory system 100 may also include other discrete components 140, such as external electrical interfaces, external RAM, resistors, capacitors, or other components that may interface with controller 102. In alternative embodiments, one or more of the RAID module 128, media management layer 138 and buffer management/bus controller 114 are optional components that may not be necessary in the controller 102.

Figure 2B:
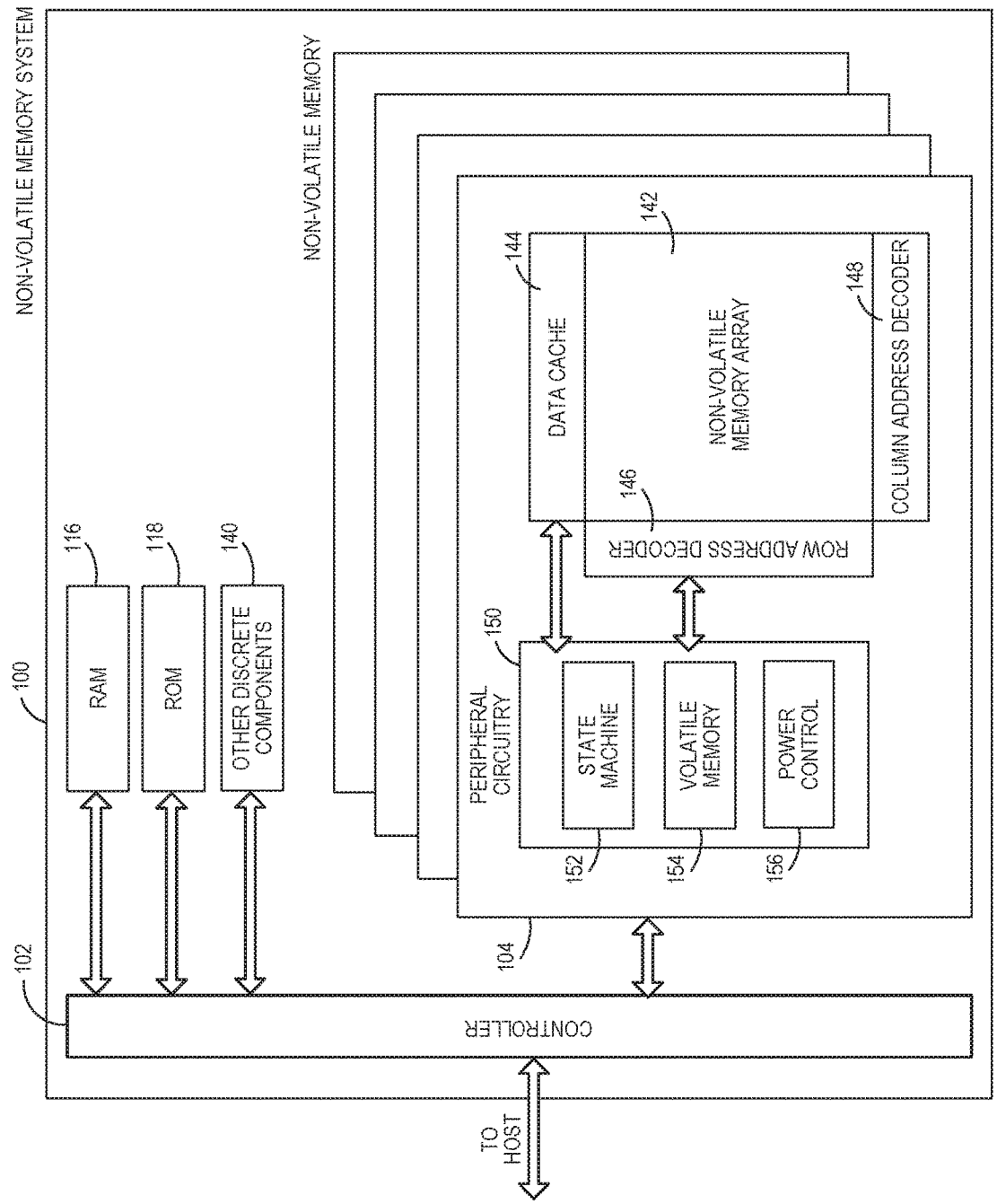
FIG. 2B is a block diagram of example components of a non-volatile memory die of the non-volatile memory system of FIG. 1A.

FIG. 2B is a block diagram illustrating exemplary components of a non-volatile memory die 104 in more detail. The non-volatile memory die 104 may include a non-volatile memory array 142. The non-volatile memory array 142 may include a plurality of non-volatile memory elements or cells, each configured to store one or more bits of data. The non-volatile memory elements or cells may be any suitable non-volatile memory cells, including NAND flash memory cells and/or NOR flash memory cells in a two dimensional and/or three dimensional configuration. The memory cells may take the form of solid-state (e.g., flash) memory cells and can be one-time programmable, few-time programmable, or many-time programmable. In addition, the memory elements or cells may be configured as single-level cells (SLCs) that store a single bit of data per cell, multi-level cells (MLCs) that store multiple (two, three, four, or more) bits of data per cell, or combinations thereof. For some example configurations, the multi-level cells (MLCs) may include triple-level cells (TLCs) that store three bits of data per cell.

Additionally, for some example configurations, a flash memory cell may include in the array 142 a floating gate transistor (FGT) that has a floating gate and a control gate. The floating gate is surrounded by an insulator or insulating material that helps retain charge in the floating gate. The presence or absence of charges inside the floating gate may cause a shift in a threshold voltage of the FGT, which is used to distinguish logic levels. That is, each FGT's threshold voltage may be indicative of the data stored in the memory cell. Hereafter, FGT, memory element and memory cell may be used interchangeably to refer to the same physical entity.

The memory cells may be disposed in the memory array 142 in accordance with a matrix-like structure of rows and columns of memory cells. At the intersection of a row and a column is a memory cell. A column of memory cells may be referred to as a string. Memory cells in a string or column may be electrically connected in series. A row of memory cells may be referred to as a page. Control gates of FGTs in a page or row may be electrically connected together.

The memory array 142 may also include wordlines and bitlines connected to the memory cells. Each page of memory cells may be coupled to a wordline. In particular, each wordline may be coupled to the control gates of FGTs in a page. In addition, each string of FGTs may be coupled to a bitline. Further, a single string may span across multiple wordlines, and the number of FGTs in a string may be equal to the number of pages in a block.

Figure 3:
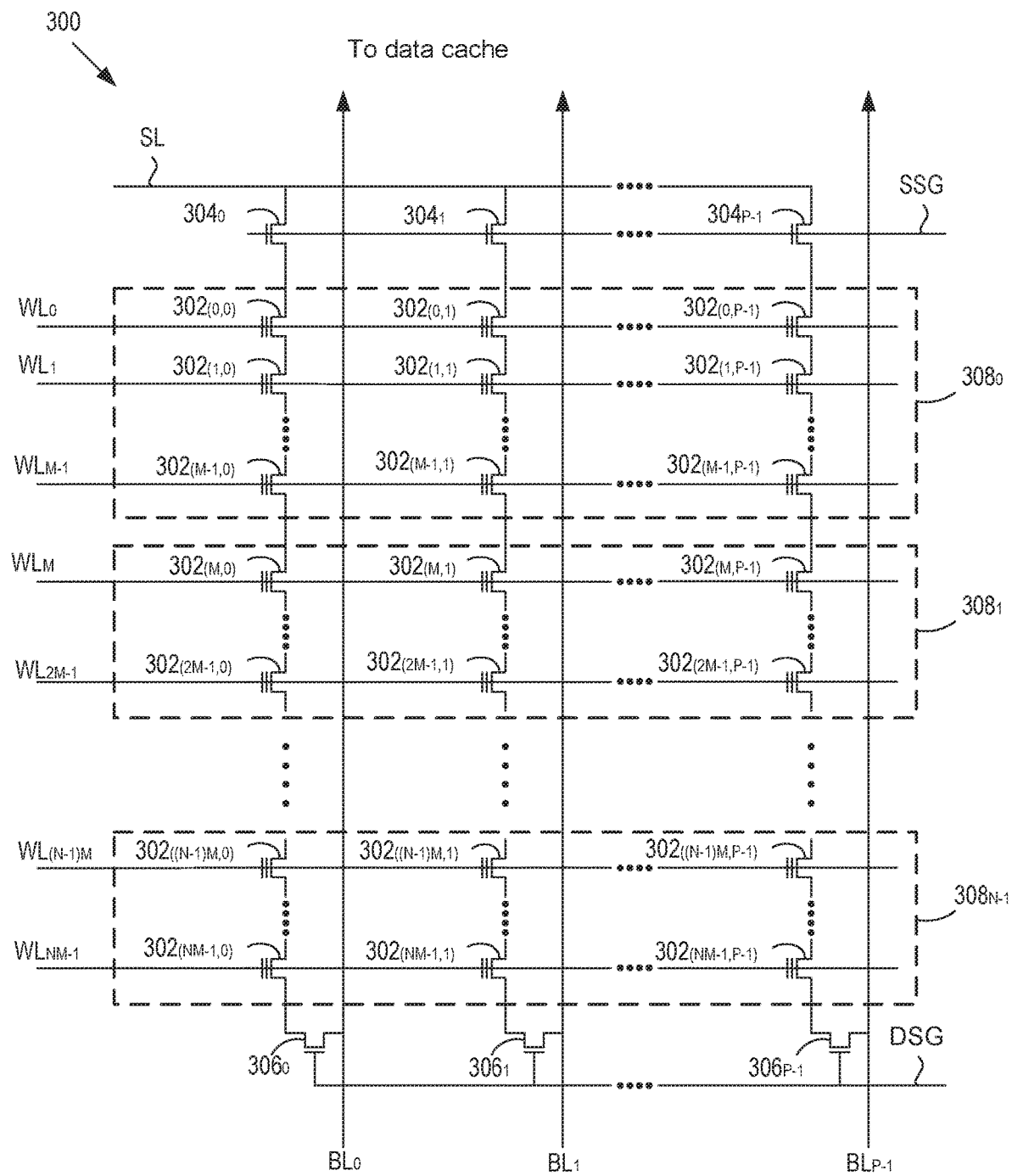
FIG. 3 is a circuit schematic diagram of an example NAND-type flash memory array.

FIG. 3 is a circuit schematic diagram of at least a portion of an exemplary NAND-type flash memory array 300, which may be representative of at least a portion of the memory array 142. The memory array portion 300 may include a P-number of series-connected strings of (N times M) FGTs, each coupled to one of a P-number of bitlines $BL_1$ to $BL_{P-1}$, where N is the number of blocks $308_0$ to $308_{N-1}$ in the memory array 300, and M is the number of pages of FGTs coupled to wordlines WL in each of the N-number of blocks $308_0$ to $308_{N-1}$.

To sense data from the FGTs, a page of FGTs and a corresponding wordline may be selected, and current sensing of bitlines may be employed to determine whether a floating gate of a FGT in the selected page contains charge or not. Current that flows through a string may flow from a source line SL, through the string, to a bitline BL to which the string is coupled. The string may be coupled to the source line SL via a source select transistor, and may be coupled to its associated bitline BL via a drain select transistor. For example, a first string of FGTs $302_{(0,0)}$ to $302_{(NM-1,0)}$ may be coupled to the source line SL via a source select transistor $304_0$ that is connected to the source line SL, and may be coupled to its associated bitline $BL_0$ via a drain select transistor $306_0$. The other strings may be similarly coupled. Switching of source select transistors $304_0$, $304_1$, ..., $304_{P-1}$ may be controlled using a source select gate bias line SSG that supplies a source select gate bias voltage $V_{SSG}$ to turn on an off the source select transistors $304_0$, $304_1$, ..., $304_{P-1}$. Additionally, switching of drain select transistors $306_0$, $306_1$, ..., $306_{P-1}$ may be controlled using a drain select gate bias line DSG that supplies a drain select gate bias voltage $V_{DSG}$ to turn on and off the drain select transistors $306_0$, $306_1$, ..., $306_{P-1}$.

Referring back to FIG. 2B, the non-volatile memory die 104 may further include a page buffer or data cache 144 that caches data that is sensed from and/or that is to be programmed to the memory array 142. The non-volatile memory die 104 may also include a row address decoder 146 and a column address decoder 148. The row address decoder 146 may decode a row address and select a particular wordline in the memory array 142 when reading or writing data to/from the memory cells in the memory array 142. The column address decoder 148 may decode a column address to select a particular group of bitlines in the memory array 142 to be electrically coupled to the data cache 144.

In addition, the non-volatile memory die 104 may include peripheral circuitry 150. The peripheral circuitry 150 may include a state machine 152 that may be configured to control memory operations performed on the die 104 and provide status information to the controller 102. The peripheral circuitry 150 may also include volatile memory 154. An example configuration of the volatile memory 154 may include latches, although other configurations are possible. In addition, the peripheral circuitry 150 may include power control circuitry 156 that is configured to generate and supply voltages to the memory array 142, including voltages (such as in the form of voltage pulses) to the wordlines, erase voltages (such as in the form of erase voltage pulses), the source select gate bias voltage $V_{SSG}$ to the source select gate bias line SSG, the drain select gate bias voltage $V_{DSG}$ to the drain select gate bias line DSG, as well as other voltages that may be supplied to the memory array 142. In one example configuration, the power control circuitry 156 may include charge pumps to generate the voltages, although other configurations may be possible.

Figure 4:
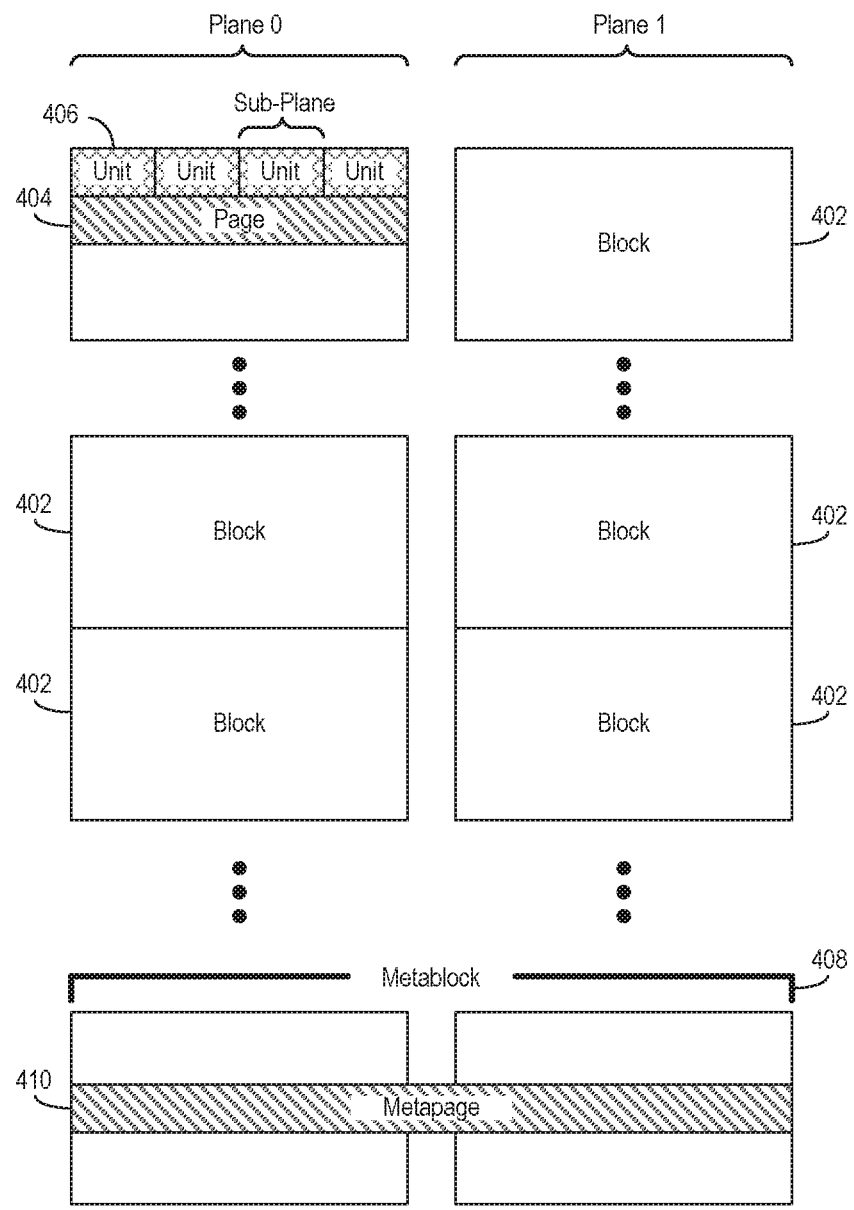
FIG. 4 is a block diagram of an example organizational arrangement or hierarchy of a memory array for flash memory.

Referring to FIG. 4, the memory array 142 and/or a plurality of memory arrays 142 spanning multiple memory dies 104 may have an organizational arrangement or hierarchy under which memory cells of the memory array 142 and/or multiple memory arrays 142 of multiple memory dies 104 may be organized. The controller 102 may be configured to store and access data in accordance with the organizational arrangement or hierarchy.

FIG. 4 is a block diagram of an example organizational arrangement or hierarchy of a memory array 142 for flash memory. As mentioned, for flash memory, the memory cells may be divided or organized into blocks 402, and each block 402 may further be divided into a number of pages 404. Each block 402 may contain the minimum number of memory elements that may be erased together. In addition, each page 404 may be a unit of sensing in the memory array 142. Each individual page 404 may further be divided into segments or units 406, with each segment or unit 406 containing the fewest number of memory cells that may be written to at one time as a basic programming operation. Data stored in a segment or unit of memory cells—referred to as a flash memory unit (FMU), an ECC page, or a codeword—may contain the amount of data that is written at one time during a basic programming operation and/or the amount of data that can be encoded or decoded by the ECC engine 124 during a single encoding or decoding operation. The pages 404 may be divided into the same number of segments or units. Example numbers of segments or unit may be four or eight, although other numbers are possible. In general, data may be stored in blocks and pages of memory elements non-contiguously (randomly) or contiguously.

In addition, the organizational arrangement or hierarchy may include one or more planes in which each of the blocks 402 may be configured. Generally, a plane includes a "column" of blocks 402 or pages 404, although other configurations may be possible. A single memory array 142 may include a single plane or multiple planes. The example arrangement shown in FIG. 4 includes two planes, Plane 0 and Plane 1. Data stored in different planes may be sensed simultaneously or independently. Also, some organizational arrangements or hierarchies may include sub-planes. For example, each plane may include multiple sub-planes. In general, a sub-plane may include a "column" of units 406. The number of sub-planes within a single plane may depend on the number of units 406 within a single page 404. For example, as shown in FIG. 4, for configurations where a page 404 includes four units 406, then there may be four sub-planes within a single plane, such as four sub-planes within Plane 0 and/or four sub-planes within Plane 1.

Additionally, the organizational arrangement or hierarchy may include metablocks 408 and metapages 410. A metablock address or number identifying a metablock may be mapped to and/or correspond to a logical address (e.g., a logical group number) provided by a host. A metablock 408 and a metapage 410 may span or be distributed across a respective single block and page in a single plane, or alternatively, may span or be distributed across respective multiple blocks and multiple pages across multiple planes. FIG. 4 shows the metablock 408 and the metapage 410 spanning across two planes, Plane 0 and Plane 1. Depending on the organizational arrangement, metablocks 408 and metapages 410 spanning across multiple planes may span across only those planes of a single memory die 104, or alternatively may span across multiple planes located of multiple memory dies 104.

Referring back to FIG. 3, the organizational arrangement or hierarchy may also group the bitlines (BL) into groups (otherwise referred to as columns) of bitlines (BL). Grouping the bitlines may reduce the complexity of addressing the storage locations of the array in that a column address over a page may be identified on the basis of groups (or columns) of bitlines, rather than on a bitline-by-bitline basis. In one example, a block 308 may include 16,000 bitlines (i.e., P=16,000), and every sixteen bitlines BL may be grouped together in a group (or column). Grouping the 16,000 bitlines BLs into groups or columns of sixteen may yield only 1,000 column addresses over a page, rather than 16,000 column addresses.

At some point during the lifetime of the non-volatile memory system 100, some of the memory elements of an array may store data unreliably (e.g., be determined to store data more unreliably than reliably). The memory elements may store data unreliably from the beginning of its life, such as upon being manufactured, or may initially store data reliably, but may then store data unreliably after a period of operation. There may be various reasons why these memory elements store data unreliably, such as due to open circuits, closed circuits, short circuits, endurance or retention issues (e.g., a memory element has exceeded a certain threshold number of program/erase cycles), or as a result of program disturb (when a bit is programmed into a memory element and then later, a neighboring memory element (from the same wordline or an adjacent wordline) is programmed at a higher state, causing the first memory element to be programmed at a slightly higher state). Whatever the reason, memory elements may be or become unreliable, and as a result may not reliably return data at the values at which the data was programmed.

For purposes of the present description, the term "bad" or "weak" may be used interchangeably with "unreliable." Accordingly, the term "bad" or "weak" may be used in conjunction with various storage locations or components of an array (e.g., memory elements, bit lines, bitline groups, or other groupings or zones of memory elements) to indicate those storage locations or components as unreliable and/or that are at least identified in the non-volatile memory system 100 as being unreliable or "weak". Similarly, the term "good" or "strong" may be used to refer to reliable storage locations or components and/or that are identified in the non-volatile memory system 100 as being reliable. In addition, the terms "bad," "weak," "good" and "strong" may be used in conjunction with data (including bits of data) to indicate that the data is to be stored or is being stored in reliable and unreliable storage locations, respectively.

In some situations, memory elements coupled to the same bitline may be similarly unreliable. That is, if one memory element coupled to a particular bitline is unreliable, the other memory elements that are coupled to that bitline may also be unreliable. Accordingly, the controller 102 may be configured to identify unreliable memory elements on a bitline basis. If the controller 102 identifies a bitline as unreliable, it may presume that all of the memory elements coupled to that bitline are bad, less reliable, weak, or unreliable. In addition, if the controller 102 identifies a particular memory element as unreliable, it may presume that the other memory elements coupled to the same bitline are also unreliable and identify that bitline as an unreliable or bad bitline. Also, if the controller 102 does not identify any memory elements in a bitline as being unreliable, it may identify that bitline as a reliable or good bitline.

In addition, the controller 102 may be configured to identify reliable/good and unreliable/bad columns of bitlines. For example, if the controller 102 identifies at least one bitline in a column as unreliable, it may identify all of the bitlines in that column as bad, or generally that the column is unreliable or bad. Alternatively, if the controller 102 does not identify any bitlines in a column as unreliable, it may identify that as good or reliable.

When data, such as data received from a host, is to be programmed into the memory dies 104, the data may be first encoded, and the encoded data is the version of the data that is stored in the memory dies. Encoding the data may include generating parity bits for the data, which may be used to identify and correct incorrect bits when reading the data.

Figure 5:
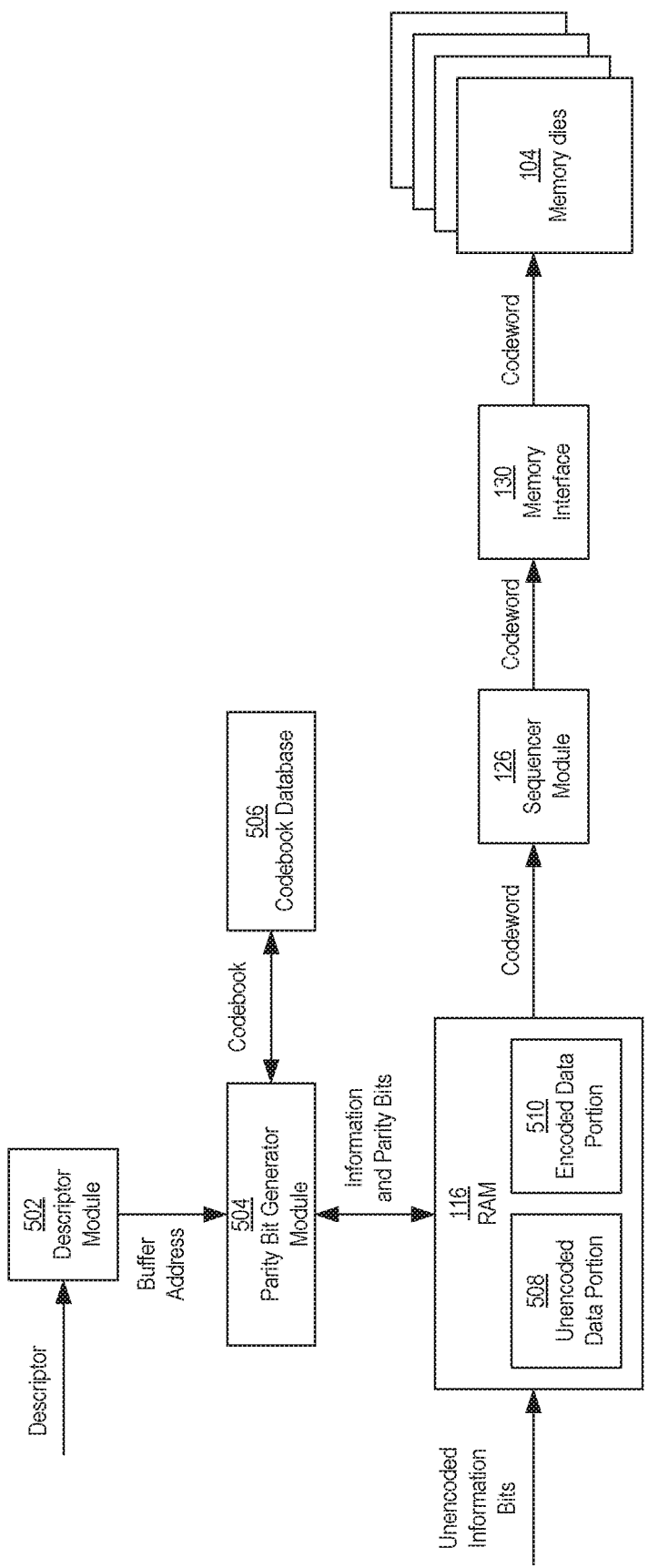
FIG. 5 is a block diagram of example modules of the memory system used to perform an encoding process.

FIG. 5 shows a block diagram of components of the memory system 100 that may be involved in an encoding process of a write operation to write data into a non-volatile memory die 104. The components may include a descriptor module 502, a parity bit generator module 504, and a codebook database 506. For some example configurations, the components may be components of the ECC engine 124 of the controller 102, although in other example configurations, some or all of these components may be considered components separate from the ECC engine 124 and/or separate from the controller 102.

In general, the non-volatile memory system 100 may store data in the memory dies 104 as codewords. Each codeword may include information data (bits) and parity data (bits). The information bits may include payload data (bits), which includes the data that the host wants written to and read from the non-volatile memory dies 104. The information bits may also include header data (bits), which may include various information about the payload data, such as logical address information, the write source, when the data is written (timestamp), flag fields, reversion numbers, and scrambler seeds as non-limiting examples. The parity bits may be generated during encoding in order to detect and correct errors of the header and payload portions of the data during a decoding phase of a read operation to read the data from the non-volatile memory die 104.

Prior to the encoding process, the information bits to be written into the non-volatile memory dies 104 may be loaded in an unencoded data portion 508 of the RAM 116 in an unencoded (e.g., raw) format. To initiate the encoding process, the descriptor module 502 may be configured to receive a descriptor from the descriptor generator module 136 (FIG. 2A). The descriptor may identify that it is a descriptor for a write operation. In addition, the descriptor may identify the buffer address where the unencoded data is being stored in unencoded data portion 508 of the RAM 116. The descriptor may also identify the physical address in the non-volatile memory die 104 where the data is to be stored.

Upon receipt of the descriptor, the descriptor module 502 may provide the physical address where the data is to be stored in the memory die 104 to parity bit generator module 504. The parity bit generator module 504 may retrieve the information bits in the encoded data portion 508 and generate the parity bits associated with the information bits.

The parity bit generator module 504 may be configured to generate the parity bits using a codebook or code stored in the codebook database 506. The codebook database 506 may be stored in any or a plurality of storage locations within the non-volatile memory system 100 and/or external to the non-volatile memory system 100. For example, the codebook database 506 may be stored in one or more of the memory dies 104. Additionally, the controller 102 may be configured to load a copy of the codebook databases 506 into the RAM 116, such as during initialization and/or when reading and/or writing data to a particular die 104.

In a particular example configuration, the codebook may be a low-density parity-check (LDPC) codebook. For LDPC encoding, an LDPC codebook may correspond to and/or have associated with it a parity-check matrix H. The parity bit generator module 502 may be configured to generate the parity bits such that following matrix equation is satisfied:

$$H\omega = 0 \qquad (1)$$

where H is the parity-check matrix and ω is the codeword including the information bits and the parity bits. The codeword ω may be formatted such the first J bits of the codeword ω are equal to an information bit sequence β of the information bits, and the last K bits of the codeword ω are equal to the parity bit sequence δ of the parity bits. The parity bit generator module 504 may then generate the parity bits such that the following equation is satisfied:

$$H \cdot \begin{bmatrix} \beta \\ \delta \end{bmatrix} = 0. \qquad (2)$$

In some LDPC encoding schemes, the parity bit generator module 504 may generate the parity bit sequence δ may be taking advantage of the sparse nature of the parity-check matrix H in accordance with LDPC.

Figure 6:
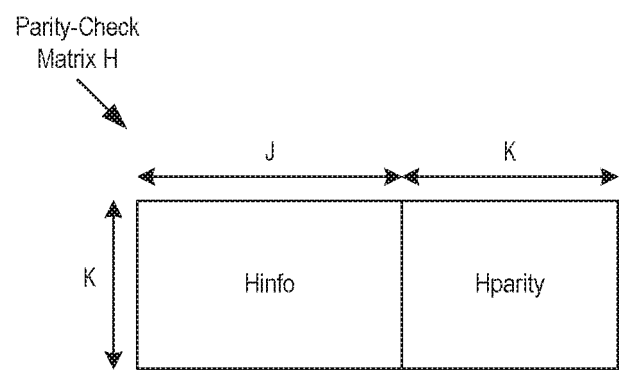
FIG. 6 is a schematic diagram of a generic layout of a parity-check matrix.

FIG. 6 shows a schematic diagram of a generic layout of a parity-check matrix H. The parity-check matrix H may include a first submatrix $H_{info}$ and a second submatrix $H_{parity}$. The first submatrix $H_{info}$ may include a J-number of columns equal to a J-number of bits in the information bit sequence β. The second submatrix $H_{parity}$ may include a K-number of columns that is equal to the K-number of bits in the parity bit sequence δ. Also, as shown in FIG. 6, each of the first submatrix $H_{info}$ and the second submatrix $H_{parity}$ have an K-number of rows equal to the K-number of bits in the parity bit sequence δ.

Additionally, the first submatrix $H_{info}$ and the second submatrix $H_{parity}$ are positioned relative to each other such that the last column of the first submatrix $H_{info}$ is adjacent to the first column of the second submatrix $H_{parity}$. Also, the order of the rows are common amongst the first and second submatrices $H_{info}$, $H_{parity}$. In other words, the first row of the first submatrix $H_{info}$ forms a common row with the first row of the second submatrix $H_{parity}$, and so on. Further, the elements of the first and second submatrices $H_{info}$, $H_{parity}$ (K by J elements for the first submatrix $H_{info}$ and K by K elements for the second submatrix $H_{parity}$) may each include binary "0" and "1" values. The makeup of the 0 and 1 values may be in accordance with various encoding schemes, such as LDPC or Quasi-Cyclic (QC)-LDPC codes, as examples.

Figure 7:
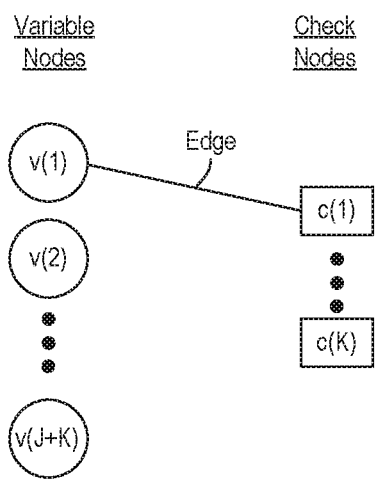
FIG. 7 is a schematic diagram of a partially completed Tanner graph corresponding to the parity-check matrix of FIG. 6.

The parity-check matrix H may have a corresponding Tanner graph. FIG. 7 shows a schematic diagram of a partially completed Tanner graph corresponding to the parity-check matrix H of FIG. 6. In general, a Tanner graph may include variable nodes (or just variables), check nodes (or just checks), and edges connecting the check nodes and the variables nodes. The number of variable nodes may be equal to the number of columns in the parity-check matrix H and the number of bits in a codeword ω. Accordingly, there may be a J+K number of variable nodes v(1) to v(J+K) corresponding to the J-number of bits in the information bit sequence β and the K-number of parity bits of the parity bit sequence δ. The number of check nodes may be equal to the number of rows in the parity-check matrix H and the number of parity bits in the parity bit sequence δ. Accordingly, there may be a K-number of check nodes c(1) to c(K) corresponding to the K-number of parity bits in the parity bit sequence δ. A particular variable node may be connected to a particular check node via an edge or connection if the element in the parity-check matrix H corresponding to that variable node and that check node has a 1 value instead of a 0 value. For example, FIG. 7 shows an edge connecting the first variable node v(1) and the first check node c(1).

Referring back to FIG. 5, upon retrieving a codebook from the codebook database 506, the parity bit generator module 504 may use the codebook to generate the parity bits δ for the unencoded information bit sequence β stored in the unencoded data portion 508 of the RAM 116, such as in accordance with equations (1) or (2) above. The information bits β and the associated parity bits δ may be combined to form the codeword ω. The codeword ω may be stored in an encoded data portion 510 of the RAM 116. The sequencer module 126 may then retrieve the codeword ω and send the codeword ω to the memory dies 104 via the memory interface 130. The codeword ω may be stored in a storage location in the memory dies 104 identified by and/or corresponding to the memory address information that was identified in the descriptor.

Figure 8:
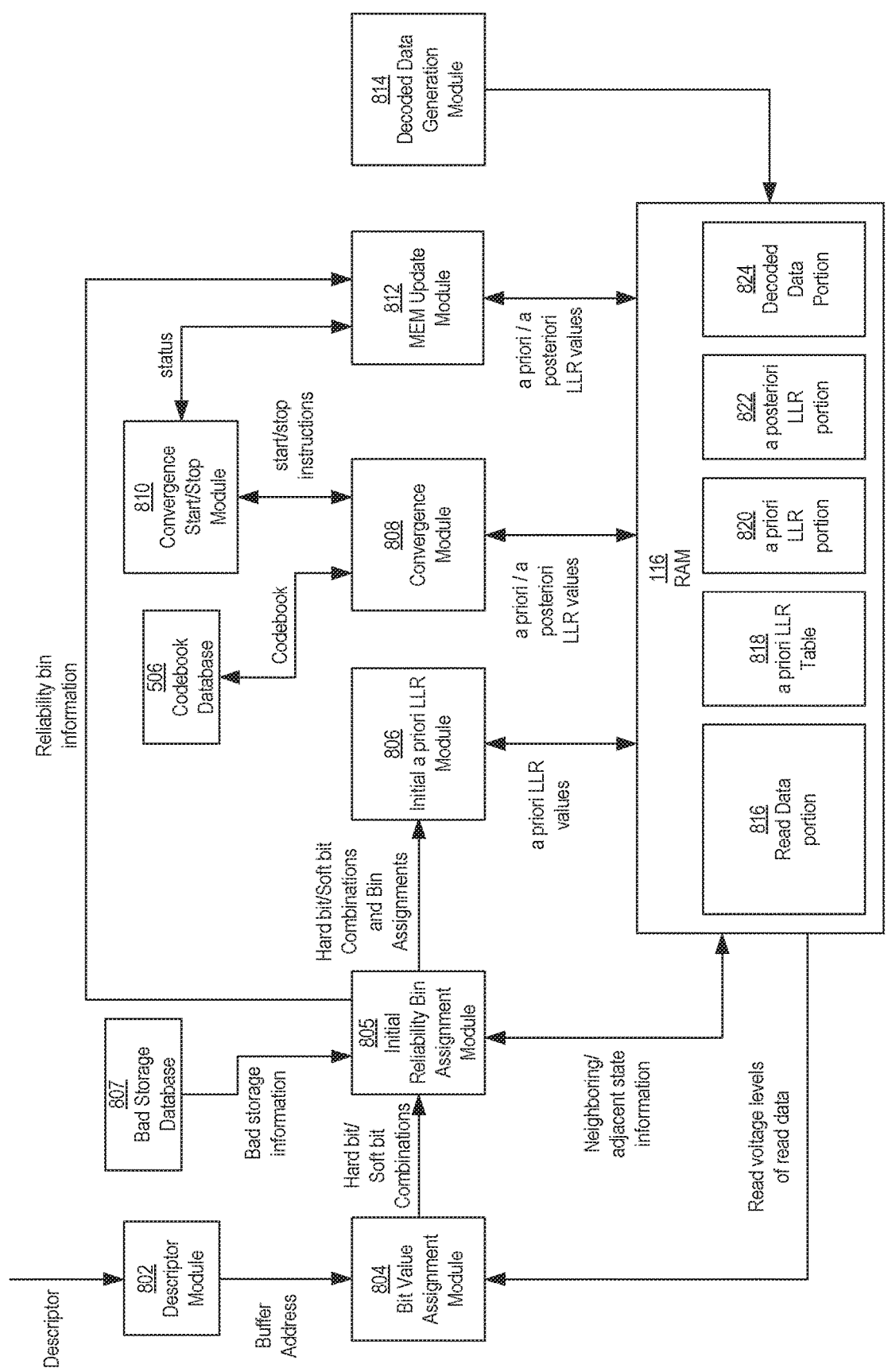
FIG. 8 is a block diagram of an example embodiment of modules of the memory system used to perform a decoding process.

FIG. 8 shows a block diagram of an example embodiment of components of the memory system 100 that may be involved in a decoding process of a read operation to read data from a non-volatile memory die 104. The components may include a descriptor module 802, a bit value assignment module 804, an initial reliability bin assignment module 805, an initial a priori log likelihood ratio (LLR) module 806, a convergence module 808, a convergence start/stop module 810, a memory error model (MEM) update module 812, and a decoded data generation module 814. For some example configurations, the components may be components of the ECC engine 124 of the controller 102, although in other example configurations, some or all of these components may be considered components separate from the ECC engine 124 and/or separate from the controller 102.

Read data (e.g., a codeword or noisy codeword) that is read from the memory dies 104 may be loaded into a read data portion 816 of the RAM 116. To initiate the decoding process, the descriptor module 802 may be configured to receive a descriptor from the descriptor generator module 136 (FIG. 2A). The descriptor may identify that it is a descriptor for a read operation. In addition, the descriptor may identify the buffer address where the encoded data is being stored in the RAM 116. The descriptor may also identify the physical address in the non-volatile memory die 104 where the encoded data is stored.

When a codeword is initially read from the memory dies 104 and loaded into the RAM 116, the bits of the codeword may indicate respective read voltage levels at which the bits were read. The bit value assignment module 804 may be configured to access the codeword loaded in the RAM 116 using the buffer address information. Upon accessing the codeword, the bit value assignment module 804 may be configured to identify the read voltage levels of the bits, and assign a bit representation corresponding to the read voltage of each of the bits of the codeword. The bit representation may be in a single-bit or multi-bit (or n-bit, where n is two or more) format. In the multi-bit format, the number of bits is typically two or three, although more than three may be possible.

In the single-bit (or one-bit) format, each ith bit of the codeword read may be represented as or by a single bit representation. These single-bit representations, referred to as hard bits, may each correspond to a logic 1 or logic 0 value and are indicative of the values of the bits as identified as being read from the non-volatile memory die 104.

In the n-bit (or multi-bit) format, each ith bit of the codeword read from the non-volatile memory dies 104 may be represented as or by an n-bit representation. Each n-bit representation may include a hard bit and an (n−1) number of soft bits. The soft bit(s) provide a probability, reliability or confidence level that the value of the associated hard bit is correct, i.e., it matches the value of the ith bit when written into the memory die 104. The combination of the hard bit and the (n−1) soft bit(s) (referred to herein as a hard bit/soft bit combination or hard bit/soft bit representation) can be one of $2^n$ possible binary values. For example, for a two-bit format, each bit of the codeword read from the non-volatile memory 104 may be represented by a two-bit representation that includes the hard bit and one soft bit, which may also include a logic 1 or logic 0 value. As another example, for the three-bit format, each bit of the codeword read from the non-volatile memory dies 104 may be represented by a three-bit representation, which may include a hard bit and two soft bits, each of which may correspond to a logic 1 or logic 0 value.

The bit value assignment module 804 may be configured to assign bit representations for each of the bits of a read codeword according to read threshold voltage levels, which may include a hard bit threshold voltage level Vt and a plurality of soft bit threshold voltage levels. For some example configurations, the read threshold levels may be set relative to cell voltage distributions (e.g., estimated cell voltage distributions).

Figure 9:
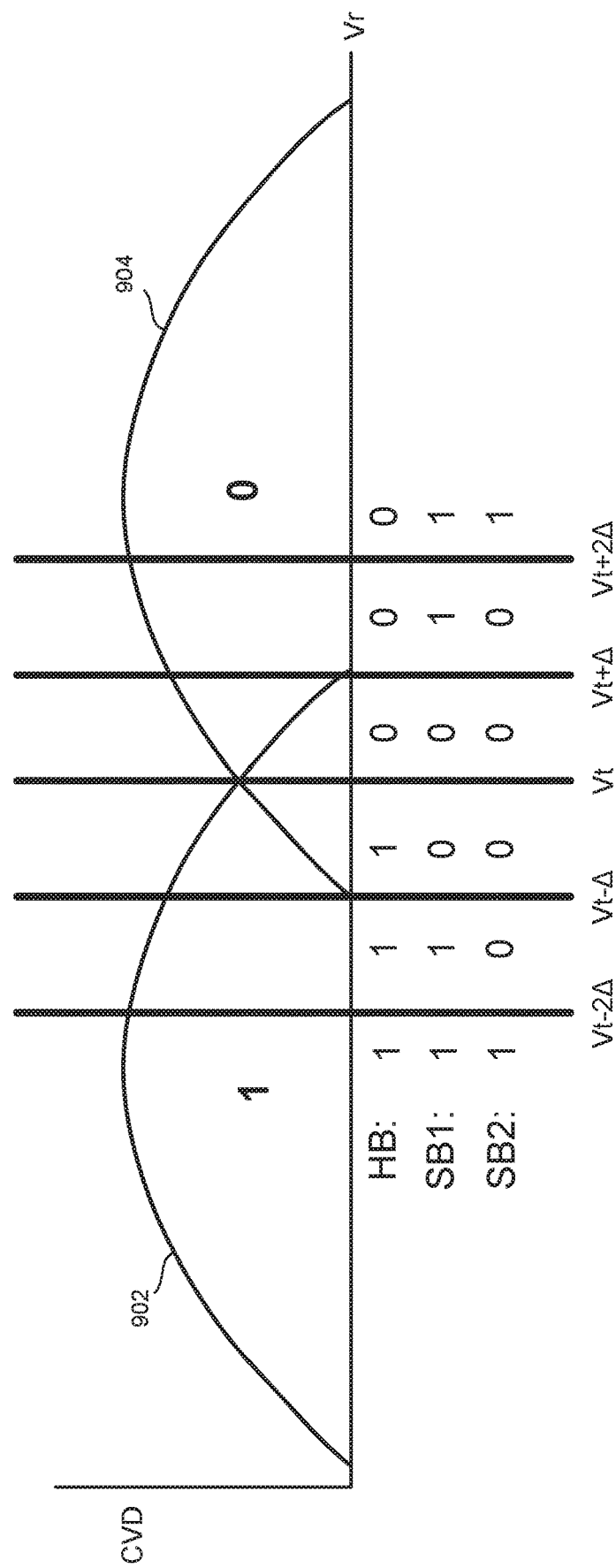
FIG. 9 is schematic diagram of cell voltage distributions and read threshold levels.

FIG. 9 shows a plot of read threshold levels plotted relative to cell voltage distributions for an encoding/decoding scheme that uses two soft bits. The cell voltage distributions of FIG. 9 may include a first cell voltage distribution (CVD) curve 902 associated logic 1 values and a second CVD curve 904 associated with logic 0 values. The first and second CVD curves may be estimated distributions of read voltages Vr associated with logic 1 and logic 0 values for bits of a given read codeword. As shown in FIG. 9, the first and second CVD curves 902, 904 may generally have the same shape, but shifted relative to the read voltage levels Vr. The first and second CVD curves 902, 904 having the same shape but shifted may indicate that the memory error model assumes a symmetric relationship between the cell voltage distributions for the logic 1 and logic 0 bits. Additionally, the shape of the first and second CVD curves 902, 904 may be modeled after a certain type of distribution, such as a Gaussian distribution, for example.

An intersection point of the first and second CVD curves 902, 904 may determine a hard bit threshold voltage level Vt. For an ith bit of the codeword, if the bit value 804 identifies the read voltage level as being greater than the hard bit threshold voltage level $V_t$, then the bit value assignment module 804 may assign a logic 0 value to the hard bit representation of that ith bit. Conversely, if the bit value assignment module 804 identifies the read voltage level as being less than the hard bit threshold level Vt, then the bit value assignment module 804 may assign a logic 1 to the hard bit representation of that ith bit.

In addition to the threshold voltage level Vt, for a two-bit soft bit scheme, four soft bit threshold voltage levels may determine the logic levels of the soft bits, with two being greater than the hard bit threshold voltage Vt and two being less than the hard bit threshold voltage Vt. In particular, going from left to right in FIG. 9, a first soft bit threshold voltage level is two times a delta amount of voltage ($\Delta$) less than the hard bit threshold voltage (Vt−2$\Delta$), a second soft bit threshold level is one delta amount of voltage less than the hard bit threshold voltage (Vt−$\Delta$), a third soft bit threshold level is one delta amount of voltage greater than the hard bit threshold (Vt+$\Delta$), and a fourth soft bit threshold level is 2 times the delta amount of voltage greater than the hard bit threshold (Vt+2$\Delta$).

For a given ith bit, where the associated read voltage level is relative to the hard bit threshold level and the soft bit threshold levels may determine the logic values assigned to the associated soft bits. In particular, with reference to FIG. 9, if the associated read voltage level is less than the first soft bit threshold level, then the bit value assignment module 804 may assign both the associated first soft bit (SB1) and the second soft bit (SB2) a logic 1 value (or in other words a two-bit soft bit value of "11"). If the associated read voltage level is greater than the first soft bit threshold level and less than the second soft bit threshold level, then the bit value assignment module 804 may assign a logic 1 value for the first soft bit (SB1) and a logic 0 value for the second soft bit (SB2) (or in other words a two-bit soft bit value of "10"). If the associated read voltage level is greater than the second soft bit threshold level and less than the hard bit threshold level Vt, then the bit value assignment module 804 may assign the first and second soft bits both a logic 0 value (or in other words a two-bit soft bit value of "00"). The soft bit logic value assignments may be mirrored for read voltages greater than the hard bit threshold level Vt. If the associated read voltage level is greater than the hard bit threshold level Vt and less than the third soft bit threshold level, then the bit value assignment module 804 may assign the first and second soft bits both a logic 0 value. If the associated read voltage level is greater than the third soft bit threshold level and less than the fourth soft bit threshold level, then the bit value assignment module 804 may assign a logic 1 value for the first soft bit and a logic 0 value for the second soft bit. If the associated read voltage level is greater than the fourth soft bit threshold level, then the bit value assignment module 804 may assign the associated first and second soft bits both a logic 1 value.

An aspect of the relative positioning of the first and second CVD curves 902, 904 is that for an ith bit of a codeword, the further a read voltage level is away from the hard bit threshold level Vt, the greater the likelihood that the logic level associated with the ith bit (i.e., the logic level assigned to the hard bit) is correct. That is, for read voltage levels below the hard bit threshold level Vt, the greater the amount a given read voltage level is below the hard bit threshold level Vt, the greater the likelihood that assigning a logic 1 value to the hard bit is the correct bit value for the ith bit, and the closer the given read voltage level is to the hard bit threshold level Vt, the less likely that assigning a logic 1 value to the hard bit is correct. In the same manner, for read voltage levels above the hard bit threshold level Vt, the greater the amount a given read voltage level is above the hard bit threshold level Vt, the greater the likelihood that assigning a logic 0 value to the hard bit is the correct bit value for the ith bit, and the closer the given read voltage level is to the hard bit threshold level Vt, the less likely that assigning a logic 0 value to the hard bit is correct.

The degree of likelihood or how reliable that a logic value assigned to a hard bit is correct is reflected in the soft bit values. For example, in FIG. 9, two-bit soft bit values of "11" are used to denote a highest degree of likelihood or reliability that the associated hard bit is correct, two-bit soft bit values of "10" are used to denote an intermediate or medium degree of likelihood or reliability that the associated hard bit is correct, and two-bit soft bit values of "00" are used to denote the lowest degree of likelihood or reliability that the associated hard bit is correct.

Use of the three two-bit values "11" "10" and "00" to indicate the high, medium, and low levels or reliability, respectively, is merely an example, and other ways to indicate the three different degrees of reliability may be possible. For example, the two-bit value of "00" may be used to indicate the highest degree of reliability and the two-bit value of "11" may be used to indicate the lowest degree of reliability. As another example, more than two bits may be used to indicate the three various degrees. Also, similar implementations may be made for one-bit soft bit encoding/decoding schemes or for hard bit only encoding/decoding schemes. In particular, a one-bit soft bit encoding scheme would have two levels of reliability. Also, an encoding/decoding scheme that used only hard bits would have zero levels of reliability. For simplicity, reference hereafter is made to two-bit soft bit encoding/decoding schemes, although similar implementations for other encoding/decoding schemes using zero, one, or more than two soft bits may be possible.

The initial reliability bin assignment module 805 may group each of the bits of a read codeword, or assign each of the bits of the read codeword to, one of a plurality of reliability bins. Bits that are grouped into the same reliability bin may have one or more reliability features in common. A reliability feature may be indicative of or used to indicate a reliability or confidence level that an associated ith bit of the codeword is read at the correct logic value.

In one example configuration, a reliable feature may be the soft bit values assigned to each of the bits. That is, bits of a codeword having been assigned the same soft bit value (e.g., the same two-bit soft bit value) may be grouped into the same reliability bin. The bits may be grouped together in respective reliability bins irrespective of their hard bit values. So, for example, the initial reliability bin assignment module 805 may group together bits assigned soft bit values of "11" (including bits with hard bit values of "1" and bits with hard bit values of "0") into a first initial reliability bin, bits assigned soft bit values of "10" into a second initial reliability bin, and bits assigned soft bit values of "00" into a third initial reliability bin.

In another example configuration, a reliability feature may be the hard bit/soft bit combination values of the bits of the codeword. For this example configuration, the initial reliability bin assignment module 805 may group the bits into six different reliability bins, one associated with each of the six different hard bit/soft bit combination values.

In another example configuration, a reliability feature may a reliability level of the storage cell in which the bits are stored. In a particular example configuration, two storage cell reliability levels may be used—one to indicate that a bit is stored in a good memory cell and another level to indicate that a bit is stored in a bad memory cell. For this example configuration, the initial reliability bin assignment module 805 may utilize two reliability bins, one reliability bin for bits stored in good memory cells, and a second reliability bin for bits stored in bad memory cells. Other example configurations may utilize more than two cell reliability levels, such as one or more intermediate cell reliability levels for example.

As shown in FIG. 8, the initial reliability bin assignment module 805 may be in communication with a bad storage database 807, which may identify bad storage locations in the memory dies 104. The bad storage database 807 may identify the bad storage locations as bad columns, bad bitlines, bad cells, or a combination thereof. Other ways that the bad storage database 807 may identify the bad storage locations may be possible. Additionally, the bad storage database 807 may be organized and/or managed in various ways. For example, upon manufacture of the memory system 100, storage locations that are initially identified as being bad may be identified and stored in one database, while storage locations initially identified as good but then later identified as bad after operation of the memory system 100 may be stored in another database. Alternatively, the bad storage locations that are initially bad and bad storage locations that later become bad may be combined into a single database. For example, the bad storage database may be initially populated with storage locations that are initially identified as bad upon manufacture. The controller 102 may then update the database as it identified bad storage locations upon manufacture. Various ways of organizing and managing a bad storage database are possible. In addition, the bad storage database 807 may be stored in any or a plurality of storage locations within the non-volatile memory system 100 and/or external to the non-volatile memory system 100. Additionally, for some example configurations, the controller 102 may be configured to load a copy of the bad storage database 807 into the RAM 116 to manage the bad storage database 807 and/or for use during decoding of read data. For some example configurations, the initial reliability bin assignment module 805 may be configured to communicate with the bad storage database 807 to determine whether a given ith bit of a read codeword is stored in a good memory cell or a bad memory cell in order to determine which reliability bin to assign the ith bit.

Whether a bit is stored in a good memory cell or a bad memory cell may be a reliability feature because two different bits with the same soft bit value and/or the same hard bit/soft bit combination value may have different associated bit error rates if one bit is stored in a good memory cell and the other bit is stored in a bad memory cell. In addition or alternatively, certain bits being stored in bad memory cells and/or the number of bits stored in bad memory cells in a given codeword may affect the cell voltage distributions.

For another example configuration, a reliability feature may be a programmed/erased state of one or more neighboring or adjacent memory components. This reliability feature may in addition or alternatively indicate whether a read voltage level a neighboring or adjacent memory component is above or below a predetermined threshold. In addition or alternatively, the reliability feature may indicate a particular erased or programmed state of one or more neighboring or adjacent memory components. For example, for multi-level cells with four states (an erased state Er and programmed states A, B, and C), the reliable feature may indicate a state of the neighboring or adjacent memory component relative to the four states.

An adjacent memory component may be a storage page or a storage cell coupled to a wordline adjacent to the wordline in which the ith bit is stored in the memory dies 104. A neighboring memory component may be a storage page or a storage cell coupled to a wordline that may not necessarily be adjacent to, but is a predetermined number of wordlines away from, the wordline in which the ith bit is stored. The states of neighboring or adjacent memory components may be a reliability feature because of cross-coupling effects between adjacent or neighboring wordlines, which in turn may influence the cell voltage distributions, such as by shifting the cell voltage distributions.

Other example configurations may utilize a combination of two or more of the reliability features. For example, a configuration that utilizes two soft bits and a third bit to indicate storage in a good memory cell or a bad memory cell may yield six different initial reliability bins. Also, reliability features other than the ones described may be possible.

As described in further detail below, the "initial" reliability bins as utilized by the initial reliability bin assignment module 805 may be initial because they may be subject to change later on during a convergence process. For some example configurations, the number of initial reliability bins may be different than a subsequent or final set of reliability bins into which the bits of the codeword are grouped. For example, the initial reliability bins may correspond to one of the reliability features or a particular combination of reliability features, and subsequent or final reliability bins may correspond to a different reliability feature or different combination of reliability features. As a result of the change, the number of reliability bins may change, either by increasing or decreasing, during the course of the convergence process. In a particular example configuration, the initial reliability bins may correspond to the soft bit values—e.g., there may be three initial reliability bins corresponding to the three two-bit soft bit values—and the number of reliability bins may increase during the convergence process by factoring in additional reliability features, such as one or more of the hard bits, the good/bad storage cell information, or the state information of neighboring and/or adjacent memory elements. Changing or adjusting the reliability bins into which the bits of a codeword are grouped during a convergence process is described in further detail below.

The decoding components of FIG. 8 may further use reliability or soft metrics to perform decoding. Each ith reliability metric of a given set of reliability metrics may be associated with an ith bit of a codeword. A value of reliability metric may include a sign component and a magnitude component. The sign component may indicate whether the associated ith bit or its hard bit representation was identified by the bit value assignment module 804 as a logic 1 or logic 0 value. The magnitude component may indicate a likelihood, reliability, or confidence level of that value being correct. In one example decoding scheme, the higher the magnitude, the higher the likelihood or reliability. Conversely, the lower or closer the magnitude is to zero, the lower the likelihood or reliability.

As described in further detail below, the reliability metrics may be used as part of a convergence process. In general, convergence is achieved when all of the bits of a codeword are at or at least deemed to be at their correct logic values. If convergence is not achieved, then one or more bits need to be flipped—their logic levels need to be changed from logic 1 to logic 0, or from logic 0 to logic 1—in order for all of the bits to be at the correct logic levels. The reliability metrics are used for the bit flipping.

Various types of reliability metrics may be possible. One type of reliability metric is a log likelihood ratio (LLR). A LLR for a given ith bit may be defined as the log of the probability of the ith bit being a logic 0 value divided by the probability of the ith bit being a logic 1 value. A different log base may be used for the LLR, such as a natural base or a log 2 base (which may be more convenient for hardware implementation). Another reliability metric may be a likelihood ratio (LR), which is similar to the log likelihood ratio, except that it is not a log-based value. A yet another reliability metric may be the probability of the ith bit being a logic 0 value, without considering the probability of the ith bit being a logic 1 value. Other reliability metrics considering the probability of bits being certain logic values may be possible.

Hereafter, the reliability metric values that the components of FIG. 8 are described as using or generating are LLR values. However, other implementations may similarly use or generate other equivalent or corresponding reliability metrics. For example, as described in further detail below, the LLRs that are generated include a priori LLRs and a posteriori LLRs. Other implementations may similarly generate a priori decoding metrics and/or a posteriori decoding metrics other than, though equivalent or corresponding to, the a priori and posteriori LLRs that are hereafter described.

As mentioned, the LLRs that are used for the convergence process may include two types: a priori LLRs P and a posteriori LLRs Q. A priori LLRs P provide an initial set of LLR values for the bits of the codeword for the convergence process. In essence, the a priori LLR values are initial LLR estimates. If the a priori LLRs P that are determined do not initially result in convergence, then the convergence process may include changing one or more a priori LLR values, including the sign component and possibly the magnitude component. LLR values that are generated as a result of at least a portion of the convergence process being formed may be referred to as a posteriori LLRs Q. Any changes to the a priori LLRs P during the convergence process may reflected or indicated in the set of a posteriori LLRs Q. When convergence is achieved, the sign components of each of the a posteriori LLRs Q indicate the logic 1 and 0 levels for each of the bits of the codeword in its final, decoded state.

Before any portion of the convergence process is performed, the initial a priori LLR module 806 may be configured to determine an initial set of a priori LLRs $P^{init}$ for each of the bits of the codeword. As described in further detail below, this initial set of a priori LLRs $P^{init}$ may be updated to form a new set of a priori LLRs $P^{new}$ at least once before convergence is achieved.

In further detail, the initial a prior LLR module 806 may be configured to assign an ith initial a priori LLR $P_i^{init}$ to each of the ith bits of the codeword. For a given ith initial a priori LLR $P_i^{init}$, which value is assigned may depend on the hard bit value of the associated ith bit and which reliability bin the ith bit is in. In particular, each initial a priori LLR value may have a sign component and a magnitude component. The sign component may correspond to the value of the associated hard bit. For example, the sign component may be negative if the hard bit has a logic 1 value, and may be positive if the hard bit has a logic 0 value. The magnitude component of an initial a priori LLR value may correspond to the initial reliability bins. In particular, each reliability bin may have an associated a priori LLR magnitude value. So, in an example configuration that utilizes three initial reliability bins, a first initial reliability bin may be associated with a first a priori LLR magnitude value, a second initial reliability bin may be associated with a second a priori LLR magnitude value, and a third initial reliability bin may be associated with a third a priori LLR magnitude value. For a given ith bit of a codeword, the initial a priori LLR module 806 may be configured to select which of a plurality of a priori magnitude values to assign to the ith bit according to which initial reliability bin the ith bit is in.

For some example configurations, the a priori LLR magnitude values may be included in an a priori LLR table 818, which may be loaded into the RAM 116 as shown in FIG. 8. For these example configurations, the initial a priori LLR module 806 may be configured to access the a priori LLR table 818 to determine the a priori magnitude values for each of the ith bits of the codeword.

In addition, for a given ith bit, the initial a priori LLR module 806 may be configured to combine the sign component and the determined magnitude component to form an initial a priori LLR value for the ith bit. The combined initial a priori LLR values for the bits of the codeword may form the set of initial a priori LLRs $P^{init}$. The initial a priori LLRs $P^{init}$ may be stored in an a priori LLR portion 820 of the RAM 116. In some example configurations, the initial a priori LLRs $P^{init}$ may be stored as m-bit values. For a given ith initial a priori LLR value $P_i^{init}$, one of the bits (e.g., the first bit) of the m-bit value corresponds to the sign component and the other (e.g., last) (m−1) bits of the m-bit value correspond to the magnitude component.

When the initial a priori LLR module 906 determines the initial a priori LLRs $P^{init}$ for the bits of the codeword, the convergence module 908 may access the initial a priori LLRs $P^{init}$ to perform a convergence process. In general, the convergence process is the part of the decoding process that determines if the decoded bit values are all correct, and if not, "flips" the bit values (i.e., changes logic levels from logic 0 to logic 1 or from logic 1 to logic 0) of certain bits until all of the bits are set at their correct values. Additionally, for some example configurations, the convergence module 808 may utilize a matrix that represents a set of polynomial equations to perform the convergence process. In addition or alternatively, the convergence process may involve message passing between the check nodes and the variable nodes of an associated codebook used to encode the codeword. As shown in FIG. 8, the convergence module 808 may be configured to access the codebook from the codebook database 506 in order to perform the message passing between the check nodes and the variable nodes. In addition or alternatively, the convergence module 808 may utilize a syndrome weight value, which may be the sum of all of the syndrome values of the check nodes.

Additionally, the convergence process may include determining whether convergence for the codeword is achieved. If convergence is achieved, then the convergence module 808 may determine that the bit values of the codeword are all correct Conversely, if convergence is not achieved, then the convergence module 808 may determine that at least one bit value is incorrect and determine that bit flipping needs to be performed in order to achieve convergence. The convergence module 808 may determine which of the bits need to be flipped in order to achieve convergence. As previously described, the convergence module 808 may use the LLRs for the bit flipping. In particular, for a given set of LLRs used in a convergence process, bits are flipped by flipping or changing the sign components of the associated LLR values, such as from positive to negative to change a logic 0 to logic 1, or from negative to positive to change a logic 1 to a logic 0. To determine which of the LLR values to flip, the convergence module 808 may look to the magnitude components of the LLR. To illustrate, and as previously described, in one example decoding scheme, the higher the magnitude, the higher the likelihood or reliability. Conversely, the lower or closer the magnitude is to zero, the lower the likelihood or reliability. In such a decoding scheme, the convergence module 808 may be more prone to flip sign components for those LLRs with lower magnitude components since they indicate a lower reliability or confidence level that their sign components are correct.

At the start of a convergence process, assuming that convergence is not initially achieved—i.e., that at least some bit flipping needs to be performed for all of the bits to be at their correct logic levels, the convergence module 808 may be configured to access the initial a priori LLR portion 820 of the RAM 116 and use the initial a priori LLRs $P^{init}$ for an initial portion of the convergence process. The convergence module 808 may be configured to change sign components and/or magnitude components of one or more of the initial a priori LLRs $P^{init}$ during the initial portion of the convergence process in attempting to achieve convergence. At the end of the initial portion, the initial set of a priori LLRs $P^{init}$ in its changed state may be a set of a posteriori LLRs Q.

The initial a priori LLR magnitude values that the initial a priori LLR module 806 may assign to each of the bits of a codeword may correspond to an underlying memory error model. The memory error model may utilize a reliability characteristic for identifying the a priori magnitude values. In a particular example implementation, the reliability characteristic is bit error rate, although other reliability characteristics may be possible. A further aspect of the memory error model is that it may consider the reliability characteristic on a reliability bin-by-bin basis. In other words, the memory error model may associate reliability characteristic values differently or independently for each of the initial reliability bins. In this regard, the memory error model may define and/or be characterized by a set or vector of reliability characteristic (RC) values, RC=[$RC_1$ ... $RC_L$], where L is a number of reliability bins. For some example memory error models, L may correspond to a number of voltage bins corresponding to a number of possible soft bit values or a number of hard bit/soft bit combination vales. Bits of a read codeword may be associated with the L-number of reliability characteristic values according to which reliability bin the bits are associated. So, for example where the reliability characteristic is bit error rate (BER), the memory error model may be used for associating bits in a first initial reliability bin with a first BER value, bits in a second initial reliability bin with a second BER value, and so on. The initial a priori magnitude values associated with each of the initial reliability bins may correspond to the reliability characteristic values associated with the respective bins.

The reliability characteristic values may be estimated values based on certain assumptions. One assumption may be that there is symmetry between the logic 1 and logic 0 values that are read. For example, referring back to FIG. 9, the memory error model may presume that the first and second cell voltage distribution curves 902, 904 have the same shape (e.g., a Gaussian shape) and are symmetrical with respect to the hard bit threshold level Vt. Also, the same delta value (Δ) may be used to set the first, second, third, and fourth soft bit threshold levels, which in turn may result in the first and second soft bit threshold levels being symmetrical to the third and fourth soft bit threshold levels with respect to the hard bit threshold level Vt. As a result of the symmetrical relationship, the a priori LLR magnitude components for two hard bit/soft bit combination values with different hard bit values but the same soft bit values may be the same. That is, due to the symmetry, the hard bit/soft bit combination values of "111" and "011" may have respective initial a priori LLR values with different sign components but the same magnitude component. The same may be the case for the hard bit/soft bit combination values of "110" and "010", as well as for the hard bit/soft bit combination values of "100" and "000."

Another assumption of the memory error model may be that the bits are stored in cells having the same reliability or, otherwise stated, the memory error model assumes that all of the memory cells are good cells. Another assumption of the memory error model may be that there is no cross-coupling between adjacent or neighboring wordlines.

In actual implementation, the assumptions may not accurately reflect the actual storage conditions of a given read codeword, resulting in mismatch between the initial, assumed memory error model for a given read codeword and the actual reliability characteristics of the bits of the codeword. For example, cell voltage distributions for the logic 1 and logic 0 bits may not be symmetric and/or may not follow the modeled shape—e.g., a Gaussian shape, the data is stored in varying numbers of good and bad storage locations, and cross-coupling effects vary for different states or neighboring or adjacent memory components. Various conditions or situations may cause this to happen, such as multiple reads generating read disturb, reading at different points of a write/erase cycles, reading data that has been stored for a very long period of time (data retention), reading during different or wide variations in temperature conditions, or reading at offset (suboptimal) read thresholds, or outlier memory pages, as non-limiting examples. As a result, the memory error model may not provide optimal estimations of its reliability characteristic (e.g., bit error rate), and in turn, the initial a priori magnitude values used for start the convergence process may not be optimal or optimally reliable values.

As a result of using less-than-optimal a priori LLR values, the convergence process may take longer to reach convergence than if better initial a priori LLRs $P^{init}$ were used, or worse, the convergence process gets "stuck" (i.e., the convergence module 808 is unable to figure out the correct combination of bits to flip to achieve convergence) and convergence cannot be achieved.

In the present description, instead of just calculating an initial set of a priori LLRs $P^{init}$ and then performing a single, continuous convergence process based on the initial set of a priori LLRs $P^{init}$, a positive feedback convergence process is implemented in which after a portion of a convergence process is performed and before convergence is achieved, information obtained as a result of performing the portion, as reflected in a current set of a posteriori LLRs $Q^{cur}$ generated during the portion, is used to update or improve the reliability characteristic of the memory error model, which in turn is used to generate a new/updated set of a priori LLRs $P^{new}$ and a new/updated set of a posteriori LLRs $Q^{new}$. The new/updated set of posteriori LLRs $Q^{new}$ is then used for a subsequent portion of the convergence process, and convergence may ultimately be achieved based on the new/updated set of a posteriori LLRs $Q^{new}$. Calculating the new/updated a posteriori LLRs $Q^{new}$ and using those values during subsequent portions of the convergence process may provide a "boost" to the convergence process, allowing convergence to be achieved faster and/or "stuck" portions of the process to be overcome, resulting in overall improved decoding latency and better Quality of Service (QoS) metrics. The reliability characteristic of the memory error model, and in turn new/updated sets of a priori and a posteriori LLRs $P^{new}$, $Q^{new}$ may be updated once or alternatively multiple times during the course of a convergence process.

In addition, for some example configurations, the number of reliability bins may change during the course of the convergence process. In turn, the number of reliability characteristic values that are updated may also change to correspond to the changed number of reliability bins. In particular examples, the number of reliability bins may increase from an initial number. As previously described, the change in number may be due to the reliability bins being determined according to different reliability features, different combinations of reliability features, and/or by adding one or more reliability features to an initial set of one or more reliability features used to form the initial reliability bins. For example, the number of initial reliability bins may be based on the number of different two-bit soft bit values (e.g., three), and subsequent reliability bins may be further based on additional reliability features such as hard bit values, good/bad storage information, and/or state information of neighboring or adjacent memory components, as previously described.

Additionally, a change in reliability bins may result in a change in how the bits of a codeword are grouped into the reliability bins. For example, bits with bit representations of "111" and bits with bit representations of "011" may be initially grouped into the same reliability bin. Subsequently, after a change in the configuration of the reliability bins in which the hard bit values are used to configure the reliability bins, bits with bit representations of "111" and bits with bit representations of "011" may be grouped into different reliability bins due to having different hard bit values. As another example, suppose two bits, both with two-bit soft bit representations of "11," were initially grouped into the same reliability bin. However, suppose one of the bits was stored in a bad memory cell while the other was stored in a good memory cell. As a result of a change in the reliability bin configuration by further considering good/bad storage cell information, the two bits may be separated into different reliability bins.

Where a change in a reliability bin configuration results in an expansion of the number of reliability bins, the change may be considered an "unmerging" of reliability bins. That is, in an initial configuration, by not considering some of a plurality of reliability features, the initial reliability bins may be considered to be in a "merged" state. Subsequently, as additional reliability features are considered when configuring the reliability bins, the reliability bins may be "unmerged" or in an "unmerged" state. Additionally, the reliability bins in their "merged" state may correspond to a symmetry assumed by the memory error model, and the "unmerging" of the reliability bins may correspond to the actual asymmetry experienced in the reading of the codeword.

This procedure may allow for robustness, especially against situations where suboptimal read thresholds (e.g. the hard bit threshold level Vt as shown in FIG. 9) is offset towards the first CVD curve 902 or the second CVD curve 904), resulting in asymmetry. For example, read thresholds and a "merged" set of reliability bins corresponding to symmetry assumed by the memory error model may be initially established. Subsequently, if convergence is not achieved after a certain amount of time, an asymmetric memory error model may be allowed due to an "unmerging" of the reliability bins, which in turn may allow for a higher probability to successfully achieve convergence in the case that read thresholds are offset (resulting in an asymmetric memory error model). At the same time, the procedure does not add a significant amount of complexity to the decoding portion of the ECC engine 124.

The convergence start/stop module 810 may be configured to control the starting and stopping or pausing of the convergence process performed by the convergence module 808. The start/stop module 810 may be configured to monitor the convergence process and use any or combinations of various criteria for determining when to stop or pause the convergence process. In one example, the convergence start/stop module 810 may stop or pause the convergence process when a number of iterations of the convergence process has reached or exceeded a threshold level. An iteration may be defined by one cycle through the variable nodes for a certain aspect of the convergence process, such as bit flipping or message passing. As another example criterion, the convergence start/stop module 810 may stop or pause the convergence process upon determining that the convergence process is stuck or not progressing at a fast enough rate. For example, the start/stop module 810 may be configured to measure a metric associated with a progress level of the convergence process. If the progress level falls below a threshold level, then the start/stop module 810 may determine to stop or pause the convergence process. For some examples, the metric may be and/or correspond to the magnitudes of the a posteriori LLR values Q. For example, a predetermined number of a posteriori LLRs Q not increasing in magnitude, an average rate at which the a posteriori LLR magnitude values are increasing being below a threshold level, an average value of the a posteriori LLR magnitudes, or some combination thereof may indicate that the progress level of the convergence process has fallen below a threshold level, which in turn may cause the convergence start/stop module 810 to stop or pause the convergence process.

When the convergence start/stop module 810 has caused the convergence module 808 to stop or pause the convergence process, the a posteriori LLRs Q in their current state may be referred to as the current a posteriori LLRs $Q^{cur}$. When the convergence process is stopped or paused, the current a posteriori LLRs $Q^{cur}$ may be stored in the a posteriori LLR portion 822 of the RAM 116. In addition, when the convergence start/stop module 810 has caused the convergence module 808 to stop or pause the convergence process, the convergence start/stop module 810 may notify the MEM update module 812 that the convergence process is stopped or paused. In response, the MEM update module 812 may perform a MEM update process, during which the new/updated a priori LLRs $P^{new}$ and a posteriori LLRs $Q^{new}$ are calculated.

Figure 10:
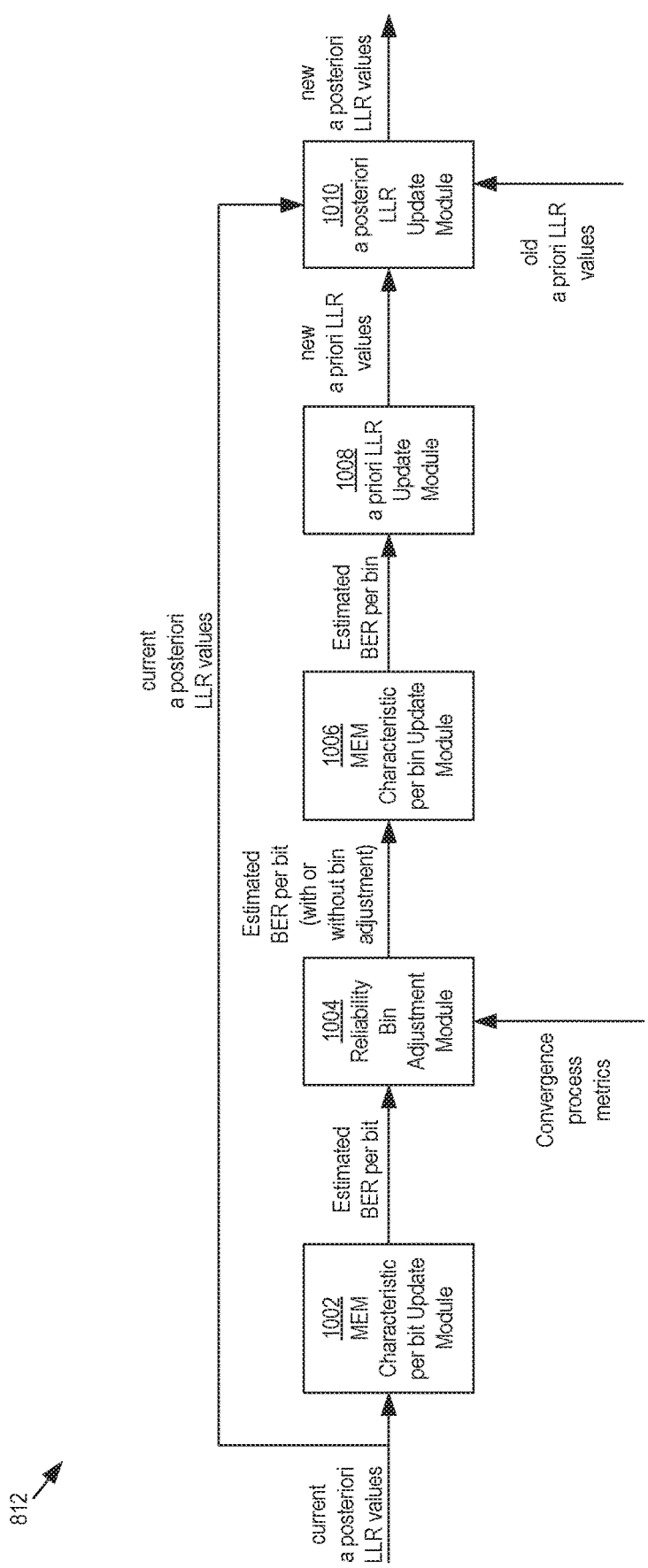
FIG. 10 is a block diagram of example components of a memory error model update module of FIG. 8.

FIG. 10 shows a block diagram of example components of the MEM update module 812 in further detail. The example components may include a MEM characteristic per bit update module 1002, a reliability bin adjustment module 1004, a MEM characteristic per bin update module 1006, an a priori LLR update module 1008, and a posteriori LLR update module 1010.

In further detail, when the MEM update module 812 is configured to start a MEM update process, as a first action, the MEM characteristic per bit update module 1002 may access the current a posteriori LLRs $Q^{cur}$ in the a posteriori LLR portion 822 and calculate updated MEM reliability characteristic values for each of the bits of the codeword based on the current a posteriori LLRs $Q^{cur}$. The reliability characteristic values are updated values in the sense that they are updated compared to the initial reliability characteristic values defining an initial memory error model upon which the initial a priori LLR values are based. In other words, the updating of the reliability characteristic values is a refining of the initial memory error model for a given read codeword that may be different that the initially assumed memory error model according to the storage location (page) in which codeword is stored (due to variations in the memory fabrication process) and/or the memory condition (e.g. wear level, elapsed time from programming, temperature, disturbance effects, . . . , etc).

In a particular example configuration, the reliability characteristic of the memory model may be bit error rate, as previously described. For these configurations, the MEM characteristic per bit update module 1002 may calculate estimated bit error rate (BER) values for each ith bit of the codeword. Assuming that log base 2 LLRs are used as the reliability metric, the MEM characteristic per bit update module 1002 may do so in accordance with the following mathematical equation:

$$BER_i = \begin{cases} \dfrac{2^{-|Q_i^{cur}|}}{1+2^{-|Q_i^{cur}|}}, & \text{if sign }(Q_i^{cur}) = HB_i \\ \dfrac{1}{1+2^{-|Q_i^{cur}|}}, & \text{if sign }(Q_i^{cur}) \neq HB_i \end{cases} \quad (3)$$

where $BER_i$ represents an ith bit error rate estimation for an ith bit (associated with an ith variable node $v_i$) of the codeword, $|Q_i^{cur}|$ represents the magnitude component of the ith current a posteriori LLR $Q_i^{cur}$, $HB_i$ represents the hard bit value of the associated hard bit/soft bit combination value of the ith bit, which may also be equal to and/or correspond to the sign component of the associated ith initial a priori LLR $P_i^{init}$. Equation (3) may leverage the log base 2 relationship between bit error rate and log likelihood ratios. In addition, for a given ith bit, the MEM characteristic per bit update module 1002 may utilize equation (3) to calculate a different BER value depending on whether the sign component of the ith current a posteriori LLR $Q_i^{cur}$ matches the sign component of the ith initial a priori LLR $P_i^{init}$ (i.e., whether the convergence module 808 determined that the ith bits is one of the bits that is to be flipped).

Upon calculating estimated bit error rates for each of the bits, the MEM characteristic per bit update module 1002 may provide the estimated bit error rates to the reliability bin adjustment module 1004. In response, the reliability bin adjustment module 1004 may determine to change a reliability bin configuration for the bits of the codeword. Doing so may result in reconfiguring which reliability bin each estimated bit error rate is associated with. In some iterations of the MEM update process, the reliability bin adjustment module 1004 may determine to update a current reliability bin configuration, while in other iterations, the reliability bin adjustment module 1004 may determine not to update the current reliability bin configuration. The reliability bin adjustment module 1004 may base its decision on convergence process metrics, such as those it may receive from the convergence module 808 and/or the convergence start/stop module 810. Example convergence metrics may include a number of iterations, or a number of times the convergence start/stop module 810 has stopped or paused the convergence process to perform a MEM update process, as non-limiting examples. The reliability bin adjustment module 1004 may determine to adjust a current reliability bin configuration if a threshold associated with the convergence is reached or exceeded.

In the event that the reliability bin adjustment module 1004 determines not to reconfigure the reliability bins, then the reliability bin adjustment module 1004 may pass the estimated bit error rates to the MEM characteristic per bin update module 1006. Alternatively, if the reliability bin adjustment module 1004 determines to adjust the reliability bins, then the reliability bin may do so according to a change in reliability features, as previously described. The change in the reliability bin configuration may occur only once during the course of a convergence process, or alternatively, may occur several times. For some example configurations, the number of reliability bins may continually increase for each change due to the reliability bin adjustment module 1004 adding in another reliability feature to determine the reliability bins. In other configurations, the numbers of reliability may vary, increasing and decreasing, over the course the convergence process, depending on a particular reliability feature or combination of reliability features selected by the reliability bin adjustment module 1004 to change the reliability bin configuration.

Upon changing the reliability bins, the reliability bin adjustment module 1004 may update the bits and associated estimated bit error rates to be accordingly grouped into the new/updated reliability bins in accordance with the reliability features associated with the bits.

The reliability bin adjustment module 1004 may provide the estimated bit error rates (with or without reliability bin adjustment) to the MEM characteristic per bin update module 1006. In response to receipt of the estimated bit error rates, the MEM characteristic per bin update module 1006 may be configured to calculate average or expected, estimated bit error rates $BER_r = E_{i \in r}[BER_i]$ for each rth reliability bin. The MEM characteristic per bin update module 812 may do so by grouping each of the ith $BER_i$ values associated with each of the ith bits into their respective reliability bins. For some example configurations, as shown in FIG. 8, the initial reliability bin assignment module 805 may provide the initial reliability bin information to the MEM update module 812. Alternatively, if the reliability bin configuration has changed from its initial state, the reliability bin adjustment module 1004 may provide information associating the estimated bit error rate values for the bits with the current reliability bins. Using the reliability bin information, the MEM characteristic per bin update module 1006 may determine the reliability bin that each ith $BER_i$ value is associated with. Upon grouping each of the ith $BER_i$ values into their respective reliability bins, the MEM characteristic per bin update module 1006 may calculated expected or average, estimated bit error rates $BER_r$ for each of the reliability bins.

The MEM characteristic per bin update module 1006 may provide the average, estimated bit error rates for each of the reliability bins to the a priori LLR update module 1008. In response, the a priori LLR update module 10008 may use the average, estimated BER values for the reliability bins to calculate new/updated a priori LLRs according to the following mathematical equation:

$$P_{i \in r}^{new} = (1 - 2 \cdot HB_i) \cdot \log_2 \frac{1 - BER_r}{BER_r} \quad (4)$$

where $P_i^{new}$ represents a new or updated a priori LLR for an ith bit, $HB_i$ is the hard bit logic value of the ith bit, and $BER_r$ is the average, estimated BER of the rth reliability bin. The term "i∈r" is used to denote that the average, estimated BER that is used is the one associated with the reliability bin with which the ith bit is also associated. For example, suppose the first bit of the codeword is grouped into a first reliability bin. In turn, the average, estimated $BER_r$ value used when calculating a new a priori LLR $P_1^{new}$ for the first bit would be the first average, estimated BER determined for the first reliability bin.

Upon calculating the new a priori LLRs $P^{new}$ for the bits of the codeword, the a priori LLR update module 1008 may provide the new a priori LLRs $P^{new}$ to the a posteriori LLR update module 1010. In response, the a posteriori LLR update module 1010 may calculate new/updated a posteriori LLRs $Q^{new}$ according to the following mathematical equation:

$$Q_i^{new} = Q_i^{cur} - P_i^{old} + P_i^{new}, \quad (5)$$

where $Q_i^{new}$ represents the new/updated a posteriori LLR for the ith bit, $Q_i^{cur}$ represents the current a posteriori LLR for the ith bit when the convergence process is stopped or paused, $P_i^{new}$ represents the new/updated a priori LLR for the ith bit, and $P_i^{old}$ represents the old a priori LLR for the ith bit. For an initial MEM update process performed by the MEM update module 812 (i.e., the one performed after the convergence process is stopped or paused for the first time), the old a priori LLRs $P^{old}$ may be set to the initial a priori LLRs $P^{init}$. Thereafter, for any subsequent MEM update processes, the old a priori LLRs $P^{old}$ may be set to the last "new" a priori LLRs determined in the prior MEM update process.

Referring back to FIG. 8, upon being determined, the new a posteriori LLRs $Q^{new}$ may be stored in the a posteriori LLR value portion 822 of the RAM 116. In addition, the MEM update module 812 may send status information to the convergence start/stop module 810 indicating that it has completed the MEM update process. In response, the convergence start/stop module 810 may cause or control the convergence module 808 to resume the convergence process. In response, the convergence module 808 may access the new a posteriori LLRs $Q^{new}$ in the a posteriori LLR value portion 822 of the RAM 116, and resume the convergence process using the new a posteriori LLRs $Q^{new}$.

This process may be repeated until convergence is achieved. So, for example, if the convergence start/stop module 810 determines to stop or pause the convergence process again and convergence is not yet achieved, it may cause the convergence module 808 to stop or pause the convergence process. "New" current a posteriori LLRs $Q^{cur}$ at the time of the stoppage may be stored in the a posteriori LLR portion 822, which may be used to calculate new/updated bit error rate values for each ith bit, and in turn, average BER values for each voltage bin, as previously described. A second set of new/updated a priori LLRs $P^{new}$ and a posteriori LLRs $Q^{new}$ may be calculated, and then a next portion of the convergence process may be performed with the second set of new/updated a posteriori LLRs $Q^{new}$.

When convergence is achieved, the decoded data generation module 824 may generate the final version of the decoded data based on the last current state of the a posteriori LLRs Q. That is, as mentioned, the sign components of the LLRs may indicate the logic values of their associated bits. Accordingly, when the convergence module 808 determines that convergence is achieved, the decoded data generation module 824 may determine the sign components of the last current a posteriori LLRs $Q^{cur}$ to develop the final logic values for the decoded data. The decoded data may be stored in a decoded data portion 824 of the RAM 116. The logic values of the final version may represent and/or include the logic values of the data that is sent back to the host for completion of a host read request.

Also, it is noted that for some example configurations, the ECC engine 124 may include and/or utilize its own codeword RAM for performing aspects of the decoding. For example, one or more of the a priori LLR table 818, the a priori LLR portion 820, or the a posteriori LLR portion 822 may be part of the ECC engine's 124 codeword RAM. However, for simplicity, no distinction is made in FIG. 8 between the RAM 116 and the codeword RAM that the ECC engine 124 may include and/or utilize to perform the decoding.

Figure 11:
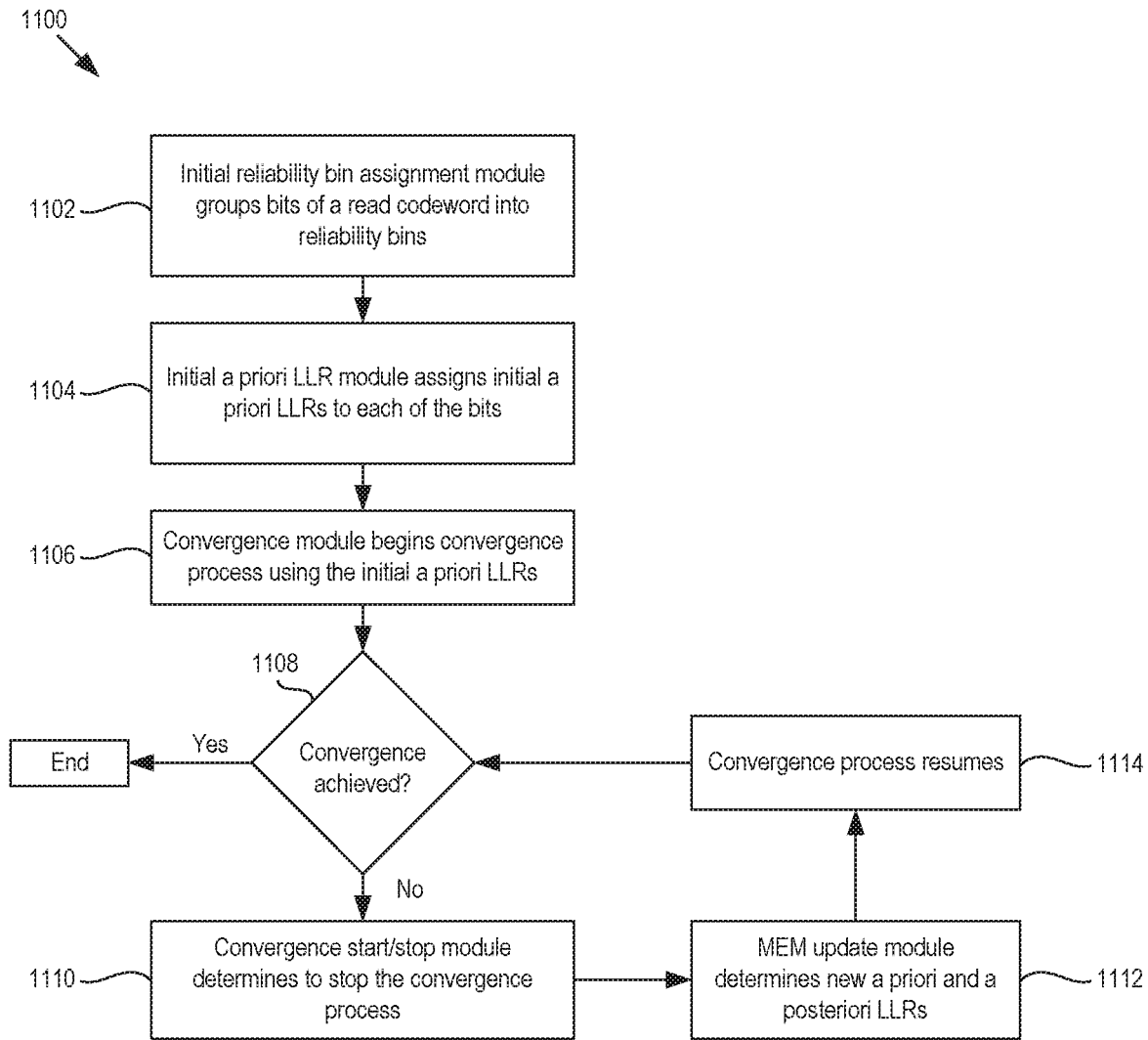
FIG. 11 is a flow chart of an example decoding method.

FIG. 11 shows a flow chart of an example decoding method 1100. The decoding method may be performed in a memory system, such as the memory system 100 and/or with the components shown of FIG. 8. The decoding method may begin when a codeword stored in memory of the memory system (e.g., the memory dies 104) is read and loaded into a RAM, such as the RAM 116. For some example methods, the codeword may be read pursuant to a host read request received from a host.

At block 1102, an initial reliability bin assignment module of the memory system, such as the initial reliability bin assignment module 805 of FIG. 8, may group the bits of the codeword into reliability bins according to reliability features, as previously described. In some example methods, at block 1102, reliability features of the bits, such as bit representations, good/bad storage location information, and/or state information of neighboring or adjacent memory components, may be determined in order to group the bits into their respective reliability bins.

At block 1104, an initial a priori LLR module of the memory system, such as the initial a priori LLR module 806 of FIG. 8, may assign initial a priori LLR values $P^{init}$ to each of the bits based on the reliability bins with which the bits are associated. The magnitude components of the initial a priori LLR values $P^{init}$ may correspond to estimated reliability characteristic, such as bit error rate or bit error rate per reliability bin, of an initial memory error model, and/or may be included in an a priori LLR table, which the initial a priori LLR module may access to determine the initial a priori LLR values $P^{init}$, as previously described.

At block 1106, a convergence module of the memory system, such as the convergence module 808 of FIG. 8, may start a convergence process for the codeword. The convergence module 808 may perform an initial portion of the convergence process using the initial a priori LLRs $P^{init}$.

At block 1108, a point at which convergence is achieved or the convergence start/stop module determines to stop or pause the convergence process is reached. If convergence is achieved, then all of the bits are at (or at least determined to be at) their correct logic levels, and the decoding method 1100 may end. Alternatively, if convergence is not achieved, then at block 1110, a convergence start/stop module of the memory system, such as the convergence start/stop module 810 of FIG. 8, may determine to stop or pause the convergence process based on one or more criterion, as previously described. In response, the convergence start/stop module may cause the convergence module to stop or pause the convergence process. Changes to the initial a priori LLRs $P^{init}$ may be reflected in a posteriori LLRs Q. Upon the convergence process being stopped or paused, a current state of the a posteriori LLRs $Q^{cur}$ may be stored in the RAM.

At block 1112, a MEM update module of the memory system, such as the MEM update module 812 of FIG. 8, may perform a MEM update process to generate a set of new or updated a priori and a posteriori LLRs $P^{new}$ and $Q^{new}$, such as with the example components shown in FIG. 8 and/or by using equations (3)-(5), as previously described. During the MEM update process, a current reliability bin configuration may stay the same or change according to one or more reliability features, as previously described. The MEM update module may store the new a priori and a posteriori LLRs $P^{new}$ and $Q^{new}$ in the RAM, and inform the convergence start/stop module that it has completed the MEM update process. In turn, at block 1114, the convergence start/stop module may cause the convergence module to resume the convergence process. In response, the convergence module may access the new a posteriori LLRs $Q^{new}$ and resume the convergence process using the new a posteriori LLRs $Q^{new}$. The method 1100 may then proceed back to block 1108, where a point during the convergence process has again reached whether convergence is achieved or the convergence start/stop module has determined again to stop or pause the convergence process.

Figure 12:
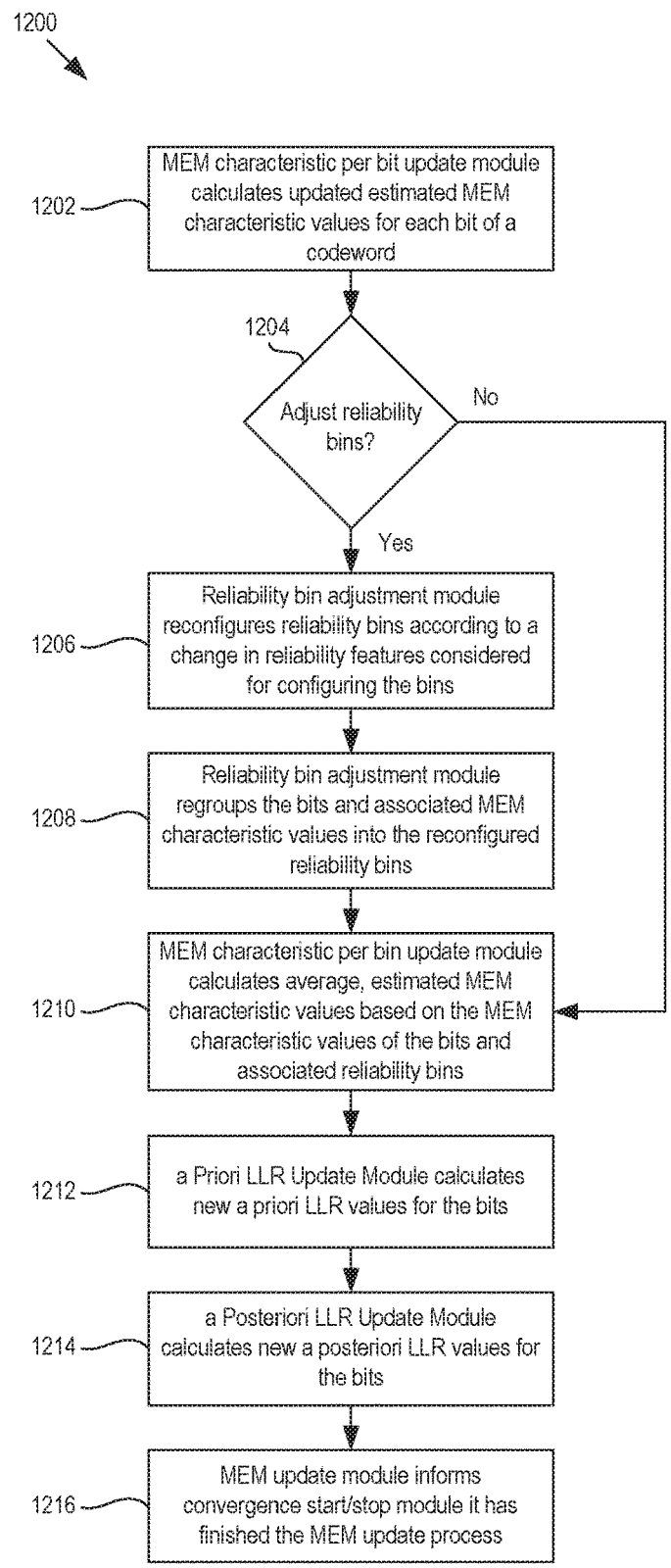
FIG. 12 is a flow chart of example method of a memory error model update process.

FIG. 12 shows a flow chart of an example method 1200 of performing a MEM update process. The method may be performed in a memory system, such as the memory system 100 and/or with the components shown of FIG. 8 and/or FIG. 10. The method may begin when a convergence start/stop module, such as the convergence start/stop module 810 of FIG. 8, determines to stop or pause a convergence process before convergence of a read codeword is achieved, and in turn, instructs a MEM update module, such as the MEM update module 812 of FIG. 8, to perform a MEM update process. The example method 1200 may be presentative of a MEM update process performed at block 1112 of FIG. 11.

At block 1202, upon the MEM update module receiving instructions to perform a MEM update process, a MEM characteristic per bit update module, such as the MEM characteristic per bit update module 1002 of FIG. 10, may calculate updated estimated MEM characteristic values for each of the bits of the codeword. In one example, the updated estimated MEM characteristic values may be estimated bit error rates that are updated relative to bit error rates of a memory error model used to set initial a priori LLR values (or other a priori reliability metric values). The MEM characteristic per bit update module 1002 may calculate the updated estimated MEM characteristic values based on a current set of a posteriori LLR values (or other current reliability metric values) that resulted at the stopping or paused point of the convergence process. Where the reliability characteristic is bit error rate, the MEM characteristic per bit update module may calculate the update estimated bit error rates according to equation (3) above.

At block 1204, a reliability bin adjustment module, such as the reliability adjustment module 1004 of FIG. 10, may determine whether to adjust a current reliability bin configuration. The reliability bin adjustment module may make the determination based on certain convergence metrics, such as a number of iterations or a number of times the convergence process is stopped or paused, as previously described.

If the reliability bin adjustment module determines to adjust the current reliability bin configuration, then at block 1206, the reliability bin adjustment module may reconfigure the reliability bins according to a change in reliability features used to determine the bins, as previously described. At block 1208, the reliability bin adjustment module may regroup the bits of the codeword and their associated estimated reliability characteristic values into the newly formed reliability bins according to the reliability features associated with the bits.

At block 1210, a MEM characteristic per bin update module, such as the MEM characteristic per bin update module 1006 of FIG. 10, may calculate average, estimated reliability characteristic values for each of the reliability bins, whether or not the reliability bins were reconfigured at block 1206. The MEM characteristic per bin update module may be configured to identify which estimated reliability characteristic value is associated with which bin in order to calculate the average, estimated reliability characteristic values for each of the reliability bins. Referring back to block 1204, if the reliability bin adjustment module determines not to change the current configuration of the reliability bins, then the method 1200 may proceed directly from block 1204 to block 1210.

At block 1212, an a priori LLR update module, such as the a priori LLR update module 1008 of FIG. 10, may generate a new or updated set of a priori LLR values (or other, similar new/updated a priori reliability metrics) based on the average, estimated reliability characteristic values for the reliability bins calculated at block 1210. Where the average, estimated reliability characteristic values are bit error rate values, a priori LLR update module may utilize equation (4) above.

At block 1214, an a posteriori LLR update module, such as the a posteriori LLR update module 1010 of FIG. 10, may generate a new or updated set of a posteriori LLR values (or other, similar new/updated a posteriori reliability metrics) based on the new/updated set of a priori LLR values generated at block 1212, and/or in accordance with equation (5) above. The new/updated set of a priori LLR values may be stored in an a posteriori LLR portion of RAM. At block 1216, the MEM update module notifies the convergence start/stop module it has finished the MEM update process.

Lastly, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A storage device comprising:
   a controller configured to:
   perform a convergence process to decode a data set, based on a memory error model, wherein:

the memory error model defines a reliability bin associated with an estimated reliability characteristic value, and a portion of the data set is associated with the reliability bin;

before convergence for the data set is achieved:

update the memory error model to an updated memory model that defines an updated reliability bin that is associated with an updated estimated reliability characteristic value; and generate an updated set of reliability metric values to decode the data set, wherein the updated set is based on the updated estimated reliability characteristic value; and complete the convergence process using the updated set of reliability metric values.

2. The storage device of claim 1, wherein the controller is further configured to:

pause the convergence process before the convergence is achieved; and generate the updated set of reliability metric values while the convergence process is paused.

3. The storage device of claim 1, wherein when the controller updates the memory error model to an updated memory model, the controller is further configured to:

generate a set of reliability metric values during a portion of the convergence process, wherein:

the set of reliability metric values define magnitude components and sign components, and the sign components correspond to hard bit representations of the data set;

calculate a set of estimated reliability characteristic values based on the magnitude components and sign components, wherein the set of estimated reliability characteristic values includes the estimated reliability characteristic value;

generate the updated set of reliability metric values based on the set of estimated reliability characteristic values; and perform a second portion of the convergence process using the updated set of reliability metric values.

4. The storage device of claim 1, wherein the updated set of reliability metric values comprises an updated set of a posteriori reliability metric values, wherein the controller is further configured to:

calculate an average of estimated reliability characteristic values for a plurality of reliability bins;

generate an updated set of a priori reliability metric values based on the average of estimated reliability characteristic values;

generate the updated set of a posteriori reliability metric values based on the updated set of a priori reliability metric values; and perform a portion of the convergence process using the updated set of a posteriori reliability metric values.

5. The storage device of claim 4, wherein the controller is further configured to:

generate a current set of a posteriori reliability metric values upon performing a current portion of the convergence process; and generate the updated set of a posteriori reliability metric values based on the current set of a posteriori reliability metric values and the updated set of a priori reliability metric values.

6. The storage device of claim 5, wherein the controller is further configured to generate the updated set of a posteriori reliability metric values based on a prior set of a priori reliability metric values.

7. The storage device of claim 1, wherein the controller is further configured to:

determine a set of reliability bins based on bits of the data set being stored in good and bad storage locations; and generate the updated set of reliability metric values based on the set of reliability bins.

8. The storage device of claim 1, wherein the controller is further configured to:

determine a set of reliability bins based on a state of a neighboring or adjacent memory component; and generate the updated set of reliability metric values based on the set of reliability bins.

9. A storage device comprising:

a controller configured to:

pause a convergence process after a portion of the convergence process is performed but before convergence is achieved;

calculate a set of reliability characteristic values associated with a memory error model, wherein the memory error model is based on a current set of reliability metric values generated from the portion of the convergence process and the memory error model defines reliability bins associated with respective reliability characteristic values of the current set of reliability characteristic values;

generate an updated set of reliability metric values based on the set of reliability characteristic values; and resume the convergence process using the updated set of reliability metric values.

10. The storage device of claim 9, wherein the controller is further configured to:

determine a number of iterations of the convergence process has reached or exceeded a threshold level; and in response, pause the convergence process.

11. The storage device of claim 9, wherein the controller is further configured to:

determine that a progress level of the convergence process is below a threshold, wherein the progress level is based on magnitude components of the set of reliability metric values; and in response, pause the convergence process.

12. The storage device of claim 9, wherein the controller is further configured to:

calculate the set of reliability characteristic values based on magnitude components of the current set of reliability metric values, wherein sign components of the current set of reliability metric values correspond to associated hard bit representations of a data set associated with the convergence process.

13. The storage device of claim 12, wherein the current set of reliability metric values comprises a current set of a posteriori log likelihood ratio (LLR) values, wherein the updated set of reliability metric values comprises an updated set of a posteriori LLR values, and wherein the controller is further configured to:

while the convergence process is paused:

calculate expected, estimated bit error rates for the reliability bins based on the set of reliability characteristic values;

generate an updated set of a priori LLR values based on the expected, estimated bit error rates; and generate the updated set of a posteriori LLR values based on the current set of a posteriori LLR values and the updated set of a priori LLR values.

14. The storage device of claim 13, wherein the controller is further configured to generate the updated set of a posteriori LLR values based on a prior set of a priori LLR values.

15. A storage device comprising:
a controller having means for:
performing a convergence process to decode a data set, based on a memory error model, wherein:
the memory error model defines a reliability bin associated with an estimated reliability characteristic value, and
a portion of the data set is associated with the reliability bin;
updating the memory error model to an updated memory model that defines an updated reliability bin that is associated with an updated estimated reliability characteristic value;
generating an updated set of reliability metric values to decode the data set before convergence for the data set is achieved, wherein the updated set is based on the updated estimated reliability characteristic value; and
completing the convergence process using the updated set of reliability metric values.

* * * * *